(12) United States Patent
Beebe et al.

(10) Patent No.: US 6,488,872 B1
(45) Date of Patent: Dec. 3, 2002

(54) MICROFABRICATED DEVICES AND METHOD OF MANUFACTURING THE SAME

(75) Inventors: David J. Beebe, Monona, WI (US); Jeffrey S. Moore, Savoy, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 188 days.

(21) Appl. No.: 09/625,204

(22) Filed: Jul. 21, 2000

Related U.S. Application Data
(60) Provisional application No. 60/145,554, filed on Jul. 23, 1999.

(51) Int. Cl.[7] .................................................. E04B 1/16
(52) U.S. Cl. ......................... 264/31; 422/50; 422/68.1; 264/459; 264/463; 264/255; 264/254; 264/267; 264/139; 264/240; 264/34; 264/35
(58) Field of Search .................. 422/68.1, 50; 264/493, 264/31, 494, 34, 496, 35, 255, 254, 267, 139, 4.33, 4.7, 459, 463; 216/49; 428/188, 408; 417/379

(56) References Cited

U.S. PATENT DOCUMENTS

| | | | |
|---|---|---|---|
| 4,842,783 A | 6/1989 | Blaylock | 264/1.4 |
| 5,015,843 A | 5/1991 | Seitz et al. | 250/227.21 |
| 5,346,372 A | * 9/1994 | Naruse et al. | 417/379 |
| 5,587,128 A | * 12/1996 | Wilding et al. | 422/50 |
| 6,074,725 A | * 6/2000 | Kennedy | 428/188 |
| 6,136,212 A | * 10/2000 | Mastrengelo et al. | 216/49 |
| 6,143,412 A | * 11/2000 | Schueller et al. | 428/408 |

FOREIGN PATENT DOCUMENTS
EP  0 363 504 A1  4/1990

OTHER PUBLICATIONS

R.H. Liu et al., "Passive mixing in a three–dimensional serpentine microchannel," presented at 10th Int. Conf. on Solid–State Sensors and Actuators: Transducers'99, Sendai, Japan, 1999, pp. 730–733.

G.T.A. Kovacs, *Microfluidic Devices*, McGraw–Hill: New York, NY, 1998, Ch. 9, pp. 779–901.

T. Breen et al., *Science*, 284, pp. 948–951 (1999).

P.J. Kenis et al., *Science*, 285, pp. 83–85 (1999).

E. Smela et al., *Science*, 268, pp. 1735–1738 (1995).

S. Mauro, *Journal of Microelectromechanical Systems*, 7, pp. 411–415 (1998).

B.H. Cumpston et al., *Nature*, 398, pp. 51–54 (1999).

D.J. Beebe et al., *Nature*, 404, pp. 588–590 (2000).

B.–H. Jo et al., *Journal of Microelectromechanical Systems*, 9, pp. 76–81 (2000).

T. Miyata et al., *Nature*, 399, 766–769 (1999).

(List continued on next page.)

*Primary Examiner*—Jill Warden
*Assistant Examiner*—Brian Sines
(74) *Attorney, Agent, or Firm*—Marshall, Gerstein & Borun

(57) ABSTRACT

Microfabricated devices and methods of manufacturing the devices are disclosed. The devices are manufactured from a substrate having microscale fluid channels, and polymerizing a polymerizable mixture in the channels to form stimuli-responsive operating components of the device. The operating components can be functional or structural components. The method of manufacture obviates the traditional assembly of microscale components to form a device because the microscale components are formed in situ on or within the device.

33 Claims, 13 Drawing Sheets

OTHER PUBLICATIONS

Y. Xia et al., *Angew Chem. Int. Ed., 37*, pp. 550–575 (1998).
C. Cao et al., *Acc. Chem. Res., 25*, p. 420 (1992).
H. Katz et al., *Science, 254*, p. 1485 (1991).
R.H. Liu et al., Hydrogel microvalves fabricated using in–situ polymerization, accepted by the 2000 Solid–State and Actuator Workshop, Jun., 2000, Hilton Head Island, SC.
C. Khoury et al., $TiO_2$ surface modifications for light modulated control of flow velocity, accepted microTAS2000, May 14–18, University of Twente in Enschede, The Netherlands.

J. Moorthy et al., Dependance of $TiO_2$ film size and shape for light activated flow control in microchannels, accepted 2000 Solid State and Actuator Workshop, Jun. 4–8, Hilton Head, SC.

D.C. Duffy et al., Patterning electroluminescent materials with feature sizes as small as 5 $\mu$m using elastomeric membranes as masks for dry lift–off, *Adv. Mater, 11*, No. 7, pp. 546–552 (1999).

* cited by examiner

After polymerization, 2x mask

After polymerization

The mask used, 10x
tip to tip 650 μm
circle diameter 400 μm

After polymerization, 10x
tip to tip 550 μm

Flush water, slightly swollen, 10x
tip to tip 630 μm
circle diameter 430 μm

Swelling in 1M base, tip folded

Swollen in 1M base,
tip to tip 1250 μm
circle diameter 950 μm

Shrunk in 1M acid,
tip to tip 780 μm
circle diameter 560 μm

FIG. 16A
FIG. 16B
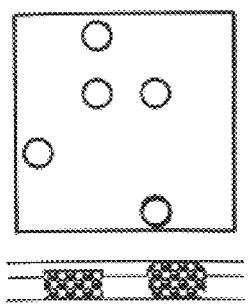
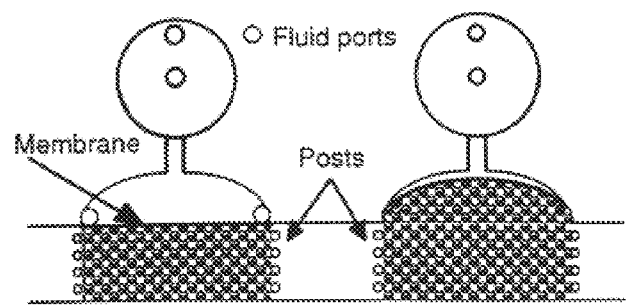
FIG. 17A
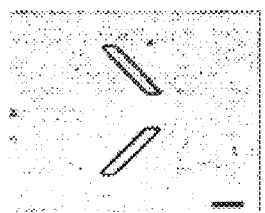
FIG. 17B
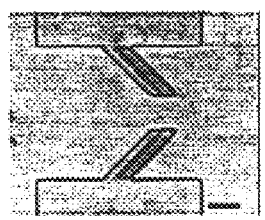
FIG. 17C
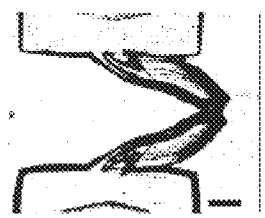
FIG. 17D
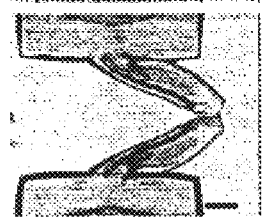
FIG. 17E
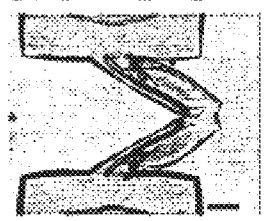
FIG. 17F
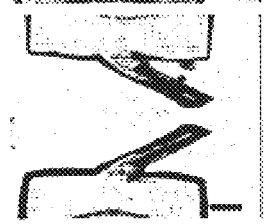

MICROFABRICATED DEVICES AND METHOD OF MANUFACTURING THE SAME

CROSS-REFERENCE TO RELATED APPLICATION

This application claims the benefit of U.S. provisional patent application Serial No. 60/145,554, filed Jul. 23, 1999.

FIELD OF THE INVENTION

The present invention is directed to microfabricated devices, to methods of manufacturing the microscale devices, and to methods of detecting a chemical change, a physical change, a chemical agent, or a biological agent using the microscale devices. In particular, the devices are manufactured from a substrate having microscale fluid channels, and polymerizing one or more polymerizable mixtures in the channels to form the operating components of the device. The method of manufacture eliminates the traditional assembly of individual microscale components to form the device.

BACKGROUND OF THE INVENTION

Current methods of manufacturing microscale devices, like microfluidic devices such as valves, pumps, and actuators, typically parallel, and are extensions of, macroscale design, manufacture, and assembly processes. For example, lithographic processes are used to add material to, or subtract material from, a substrate. The parallel approach to manufacturing microscale devices has retarded the development of complex microscale devices, especially because of difficulties in microscale device assembly, long development time, and high cost.

Presently, two approaches typically are used in the manufacture of microscale devices. The first is a true integrative approach in which lithographic processes are used to fabricate all required device components using a single process, e.g., polysilicon surface micromachining. In the second approach, fabrication of individual components is followed by component assembly to form the device. In this approach, assembly of the microscale device is identical to the assembly of a macroscale device, except uncommon methods are required to assemble microsized components. For example, slurry assembly is one method of assembling microscale components to form a microscale device.

Research in the area of microelectromechanical mechanical (MEM) systems has provided many examples of microfluidic devices and components, like miniaturized pumps and valves. Many types of microscale valves have been manufactured, including passive and active valves. However, the integration of microscale valves and other microscale components into microfluidic devices has proved difficult because a manufacturing process that provides a useful valve often is different from a manufacturing process that provides a useful pump or sensor. In other words, different device components often require different materials of construction and different types of manufacturing steps, thereby making integration of several microscale components into a single device difficult.

As stated above, two general methods of manufacturing microscale devices currently are used. Either the components are built separately, and then assembled to form the microscale device, much like assembly of a macroscale device, or traditional lithographic techniques are used to manufacture all the components of the device. The assembly approach is difficult at the microscale range for readily apparent reasons (e.g., the micron range size of the components makes handling and assembly difficult). In addition, electrostatic and other surface forces become dominant at the small size of the microscale components, thereby making manipulation of the components difficult. Lithographic processes overcome some of the problems associated with the assembly process, but integration of multiple components into a single device is hindered by the several disparate materials of construction and manufacturing methods often required to manufacture the different individual microscale components of the device.

Investigators have studied other microscale fabrication methods including fabrication of metal wires in channels, folding conductive polymer boxes, microstamping and micromolding, and two photon polymerization, but many of the above-mentioned problems associated with the manufacture of microscale devices have not been overcome. For example, T Breen et al., *Science*, 284, pp. 948–951 (1999) discloses in-channel fabrication techniques that utilize laminar flow to create textured walls and to position metal traces within microchannels. Smela et al., *Science*, 268, pp. 1735–1738 (1995) discloses conductive microscale actuators built by lithographically patterning conductive polymers on flat substrates. Two-photon polymerization has been used to provide three-dimensional structures from a polymer gel precursor (see S. Maruo, *J. Microelectromechanical Systems*, 7, pp. 411–415 (1998), and B. H. Cumpston et al., *Nature*, 398, pp. 51–54 (1999)).

The present invention is directed to a new method of manufacturing microscale devices that overcomes problems associated with traditional assembly, lithographic, and other methods. The present method permits the integration of several different microscale components, which can be manufactured from different materials of construction, into a single microscale device, without the need to assemble individual microscale components to form the device.

SUMMARY OF THE INVENTION

The present invention relates to methods of manufacturing microscale devices, to the microscale devices made by the method, and to methods of detecting a chemical or physical change, or a chemical or biological agent, using the microscale devices. More particularly, the present invention relates to a method of manufacturing microscale devices that is fundamentally different from prior manufacturing methods, solves problems and disadvantages associated with prior manufacturing methods, and retains advantages associated with prior manufacturing methods. In particular, the present method retains an advantage of a lithographic process (which avoids assembly) and retains an advantage of an assembly process (which permits integration of device components made from different materials of construction). The present manufacturing method also provides the ability to expand the functionality of microscale devices, and thereby expand the scope of microscale devices, both in types of devices and practical applications, beyond present-day limits.

Accordingly, one aspect of the present invention is to provide a method of manufacturing microscale components of a microscale device, i.e., a method of manufacturing individual microscale device components on or within a substrate to provide the completed microscale device. The microscale component can be a structural component of the device (i.e., a wall or channel of the device), or the microscale component can be a functional component of the device (i.e., a valve, a pump, an optoelectronic component, or a sensor, for example). A structural component is nonresponsive to physical and chemical changes, and to chemical and biological agents. A functional component can be responsive either to a biological agent (i.e., is bioresponsive) or to a physical or chemical change or a nonbiological chemical agent (i.e., is physio/-chemoresponsive).

Another aspect of the present invention is to provide a method of manufacturing a microscale device utilizing a substrate having one or more microscale channels, the properties of laminar fluid flow in a microscale channel, and polymerization of a polymerizable mixture at a preselected location within a channel. The substrate can have preformed channels, for example, channels prepared by lithographic techniques. Alternatively, the present method can be used to form the microscale channels in the substrate. In either embodiment, the present method is repeated as necessary to fabricate individual microscale components in the channels, from the same or different materials of construction, until manufacture of the microscale device is complete.

Yet another aspect of the present invention is to provide a method of manufacturing a microscale device wherein no manipulative assembly steps are required to form the microscale device from microscale components.

Still another aspect of the present invention is to provide a method of manufacturing a microscale device having a plurality of functional microscale components, wherein individual components can be manufactured from different materials of construction. Accordingly, microscale devices manufactured by the present method can be specifically designed for any of a variety of specific end use applications. The present method, therefore, greatly expands the number of practical applications for microscale devices.

Another aspect of the present invention is to provide a method of manufacturing microscale devices wherein development and manufacturing times are short, and the resulting devices are cost effective.

It also is an aspect of the present invention to provide microscale devices that perform as sensors, actuators, or detectors, and that provide a fast and accurate response to a preselected stimulus of interest, such as a chemical or biological compound, or a physical or chemical change, like a temperature or pH change. This aspect of the invention is achieved by manufacturing a microscale component having the appropriate functionality to respond to the stimulus of interest.

Another aspect of the present invention is to provide a microscale device capable of converting a microscale physical or chemical change, or a microscale amount of a chemical or biological agent, directly to a macroscale detectable response without the need for an external power source or other external means of converting a microscale event to a macroscale response. The microscale devices, therefore, are useful as portable detectors and sensors for physical or chemical changes, or for chemical and biological agents, for example, to detect or monitor environmental and food contaminants, changes in a chemical process, or disease treatment regimens.

Another aspect of the present invention is to solve a longstanding problem of bridging the gap between microscale and macroscale environments.

These and other aspects and advantages of the present invention will become apparent from the following detailed description of the preferred embodiments taken in conjunction with the figures.

BRIEF DESCRIPTION OF THE DRAWINGS

FIG. 8 illustrates a bioresponsive hydrogel that can be used as a microscale component of a microscale device;

FIG. 16 shows microscale detection devices of the present invention;

FIG. 17 shows a biomimetric valve prepared by the present method; and

DETAILED DESCRIPTION OF THE PREFERRED EMBODIMENTS

Figure 1A:
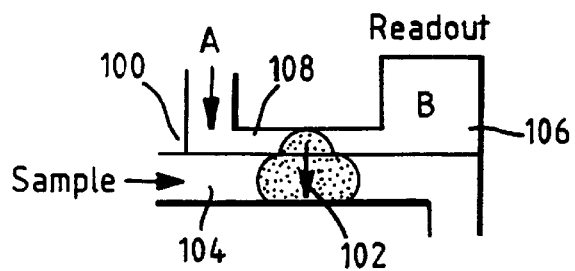
FIG. 1 is a schematic of a device of the invention illustrating sensing of an analyte and activation of the device in response to the analyte.

Existing methods of manufacturing microscale fluidic systems, and microscale devices in general, largely are extensions of macroscale manufacturing and assembly techniques. Current methods of microfabrication have tremendous value, but also have limitations. In particular, the ability to quickly manufacture complex microscale devices is very difficult. As importantly, the ability to integrate functional components, including sensing and detection components, into a microscale device is difficult. Lengthy design and fabrication processes typically are required. For example, the development of complex microscale devices using current approaches requires a time frame of months to years. Such long development and manufacturing times negate the use of microscale devices in applications that require design, development, and manufacture of a complex device in a time frame of hours to days.

A microscale device manufactured by the present method often utilizes the conversion of chemical energy into mechanical work, which is the basis of movement in living systems. The essence of such a process is captured by a variety of natural and synthetic polymer gels that undergo volume changes in response to a chemical or physical stimulus in their surrounding environment. Such polymer gels have been investigated for a variety of applications, such as actuators, sensors, controllable membranes for separations, and modulators for drug delivery.

A disadvantage encountered in all of these applications is the slow response time exhibited by such chemomechanical materials, together with a lack of response specificity to a particular stimulus. For example, for macroscale polymer structures, response times often are measured in days because diffusion of the surrounding medium into the polymeric network is the rate-limiting factor governing polymer expansion. As with any diffusion limited process, increasing the surface area to volume ratio significantly increases the speed of the process. For example, it has been found that polymer hydrogel volume changes scale with the square of the dimension. Thus, scaling hydrogels to the microscale results in substantially improved response times. Accordingly, microscale devices comprising a stimuli-responsive polymer gel positioned within a microfluidic channel achieve fast response times attributed to the microscale size of the device. For example, simplicity of fabrication and the large force generated by expansion make polymer gels ideal functional materials to regulate fluid flow in microscale systems.

Conventional actuators, e.g., electromagnetic, electrostatic, and thermopneumatic, require relatively complex assembly and an external power source for operation, which limits their use in practical applications. In contrast, stimuli-responsive hydrogels have a significant advantage over conventional microfluidic actuators because of an ability to undergo abrupt volume changes in response to the surrounding environment without the requirement of an external power source. In addition, stimuli-responsive hydrogels can respond to a variety of stimuli, such as pH, temperature, electric field, light, chemical compounds (e.g., carbohydrates), and biological agents (e.g., antigens). Because expansion of the polymeric hydrogel into the surrounding medium is the rate-limiting factor governing the swelling process, scaling the size of the hydrogel down to a micron dimension enables a fast volumetric transition that is necessary to achieve practical macroscale detection of a microscale event.

The present invention, therefore, provides a method that allows for the rapid development and manufacture of complex microscale devices that are simple to build. The method utilizes traditional and nontraditional fabrication processes (e.g., lithography/micromolding), physics of the microscale (e.g., laminar flow, short diffusion paths), and synthetic organic chemistry (e.g., functional polymers) to provide a new method of manufacturing complex microscale devices.

The present invention provides a new method of manufacturing microscale components and microscale devices, which utilizes the property of laminar fluid flow in microscale channels and the polymerization of a polymerizable mixture. The present method has many advantages over prior methods of manufacturing microscale components and microscale devices. For example, the present method eliminates manipulative assembly of individual microscale components to form a microscale device. In particular, the microscale devices are manufactured solely by the appropriate application of one or more of laminar fluid flow, substrate surface treatment, polymer chemistries, and polymerization initiation. Accordingly, the present method greatly simplifies manufacture of complex microscale devices.

The microscale devices of the present invention are useful, for example, in the detection of chemical compounds and biological agents. The present microscale devices exhibit the advantages of simple device fabrication, integration of device functionality through "in situ" component fabrication, simple operation, no external power requirements, and simple operation, but complex functionality. The microscale devices can be used to detect physical changes (like temperature changes), chemical changes (like pH changes), chemical compounds, biological agents (like pathogens or toxins), or host defense responses to biological agents. The devices also can be used in applications associated with environmental toxicology, clinical detection and diagnoses, and chemical process streams.

In the following description of the present invention, a detailed explanation of nonlimiting embodiments is presented first to broadly set forth the invention. Then, various features of the invention are explained individually and specifically.

Figure 1B:
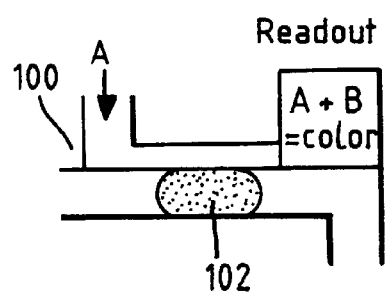

One envisioned microscale device is illustrated in FIG. 1. The device of FIG. 1 is a detection device for a component in a biological fluid (e.g., saliva, sweat, blood, or urine) or other liquid media (e.g., a process stream or a water flow). In FIG. 1, a device 100 contains a responsive hydrogel 102 in a microchannel 104. Responsive hydrogel 102 contracts upon exposure to an analyte of interest, thereby allowing component A in a microchannel 108 to flow to a chamber 106 and mix with a component B and produce detectable change, for example, a color change in chamber 106. The color change provides a macroscale response to a microscale event, i.e., contact of the analyte of interest with responsive hydrogel 102. Device 100 requires no electrical power supply, utilizes no electronics, and contains no complex microfabricated component. The responsive hydrogel 102 acts as both a sensor and an actuator to provide a direct link from a molecular event to a macroscale detection. Hydrogel 102 also can contract in response to a physical change or a chemical change in microchannel 104 to provide a macroscale response to a microscale event.

Figure 2:
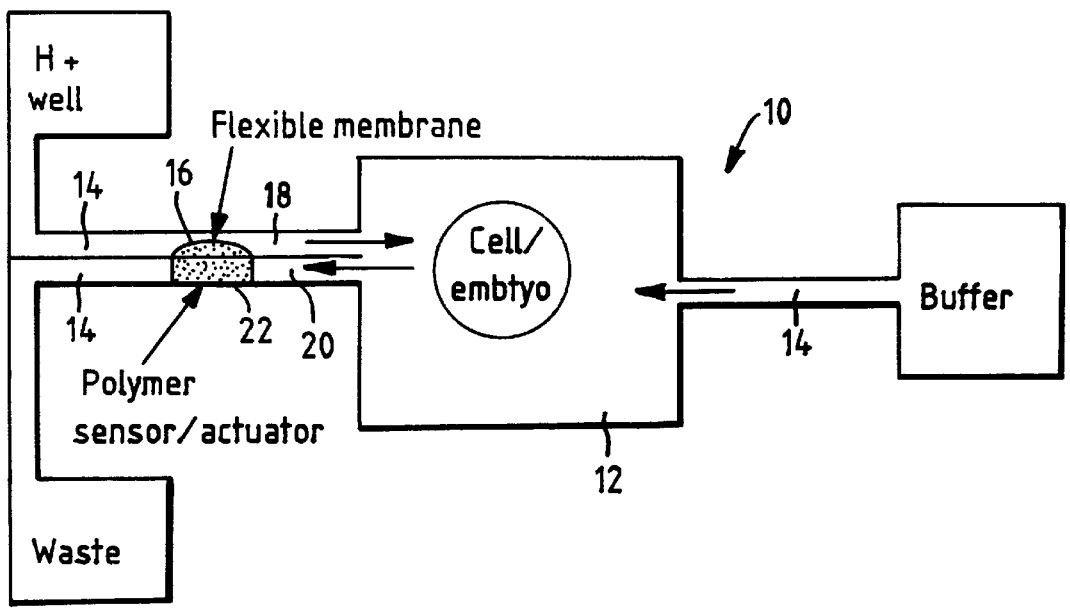
FIG. 2 is a schematic of a polymer-based pH sensor/actuator prepared by the method of the present invention.

Another device prepared by the method of the present invention is a microscale device, as illustrated in FIG. 2, that provides self-regulation of pH. In particular, pH is a critical parameter in several biofluidic systems (e.g., capillary electrophoresis and single cell/embryo analysis). In the transport, manipulation, and analysis of single animal embryos, it is important to closely regulate pH in an analysis chamber in order to facilitate analysis over the long time period of embryo development. In the case of embryos, pH regulation within a 0.3 pH range is required. The method of the present invention permits the manufacture of a microscale fluidic device that incorporates a polymer-based actuator/sensor device capable of sensing and rapidly responding to a change in pH. The microscale device does not utilize individual sensor, actuator, and control processes, but rather a single "smart," or responsive, polymer gel that senses and controls pH by porting an appropriate fluid from a reservoir in response to changes in pH.

In general, the polymer-based pH actuator/sensor is, at least in part, manufactured using a substrate having the basic structure of the microscale scale fluidic device and a spatially controlled polymerization within channels of the substrate. In this spatially controlled polymerization, if desired or required, an optional anchoring material can be patterned in a microscale channel formed in the substrate. The optional anchoring material, zirconium, for example, has a high affinity for the polymer gel comprising the pH actuator/sensor and anchors the polymer gel to a surface of channel.

The polymer gel is positioned in the channel using fluid transport through the channel, that is, a polymerizable mixture comprising the monomers that form the polymer gel and an initiator are flowed through the microscale channel, and the polymerization is effected at a previously spatially defined region in the channel by the selective application of light or other suitable energy source to that region. Regions in the channel that are to be free of the polymer gel are masked from the polymerization trigger, e.g., incident light. Polymerization, therefore, is confined to the desired spatially defined region, and any unreacted polymerization mixture is rinsed from the channel.

Polymerization can be initiated by a variety of energy sources, for example, light, heat, vibrational, electrical, or magnetic. The preferred energy source is light. The remainder of the detailed disclosure predominantly refers to light-initiated polymerizations, i.e., photopolymerization, for simplification of the disclosure. However, the invention is not limited to photopolymerizations, and other forms of polymerization initiation known persons skilled in the art can be used.

The resulting device is capable of self-regulating the pH of an analysis chamber, as illustrated in FIG. 2. In operation, the pH responsive polymer-based sensor/actuator comprises a polymer gel that undergoes a rapid and substantial volume contraction at high pH. Contraction of the polymer gel allows additional hydrogen ions to flow from a reservoir into the analysis chamber, and thereby lower the pH. In response to the drop in pH, the polymer gel expands and reduces flow from the hydrogen ion reservoir to provide a self-regulation of pH.

A microscale pH sensor/actuator 10 illustrated in FIG. 2 is manufactured as follows. Standard etching techniques can be used to form a chamber 12 and channels 14. A layer transfer process is used to form a flexible membrane 16 that is deformed by the volume contractions and expansions of a polymer-based sensor/actuator 22. Thus, device 10 is formed from channels 14 and chambers 12 etched in two separate substrates 18 and 20 (e.g., glass or silicon) with flexible membrane 16 transferred to one substrate, e.g., substrate 18, and a polymer gel 22 is patterned and formed prior to bonding substrates 18 and 20 together.

The polymeric sensor/actuator 22 is a swellable, three-dimensional polymer gel that maintains contact with a fluid in channels 14 at all times. Polymer sensor/actuator 22 is covalently bound to membrane 16 and the walls of channel 14, and uniformly fills the space in the channel 14. Although polymeric sensor/actuator 22 restricts fluid flow, fluid can be transported through the porous polymer gel to provide a continuous sensing of fluid pH.

Polymeric sensor/actuator 22 typically comprises at least three components (1) an optional anchoring material, e.g., either an initiator or a monomer, adhered to a film on a surface of channel 14, or a physical or mechanical anchor, like a post, (2) a polymerizable monomer, and (3) a polymerizable crosslinker. If an optional anchoring material is used, the monomer or initiator adhered to a surface of channel 14 can be selectively deposited onto a preselected region of channel 14. For example, phosphate groups present on a surface-bound initiator or monomer direct adsorption of these molecules onto surfaces patterned with zirconium by utilizing a known zirconium phosphonate/phosphate interaction (see, G. Cao et al., *Acc. Chem. Res.*, 25, p. 420 (1992), and H. Katz et al., *Science*, 254, p. 1485 (1991).

Formation of polymeric sensor/actuator 22 at a preselected location in chamber 14 is achieved by microfluidic delivery of a polymerizable mixture containing an appropriate monomer/crosslinker mixture (e.g., a mixture of vinyl imidazole, N-isopropyl acrylamide, and ethylene glycol dimethacrylate crosslinker). Polymerization of the polymerizable mixture can be initiated by applying incident light, or other suitable energy source, to the preselected location of polymer formation. If an optional anchoring monomer is adhered to a surface of channel 14, the anchoring monomer is threaded into the polymer gel network as polymerization of the anchoring monomer with the polymerizable mixture proceeds.

Polymerization at locations in channels 14 outside the desired location of polymer gel formation is avoided by masking such locations from the incident light or other energy source. After polymerization, excess unreacted polymerizable mixture is flushed from channels 14 to position polymeric sensor/actuator 22 in channels 14, as shown in FIG. 2. The resulting polymer gel preferably fills the gap between flexible membrane 16 and the wall of channel 14, and is strongly adhered to these surfaces. The polymeric gel contracts at high pH, and expands (e.g., swells) at a pH below 6.8. The volume change of the polymer gel between the expanded and contracted states is a factor of about 10, and is rapid because of the small size of polymeric sensor-actuator 22. The speed and degree of contraction and expansion is sufficient to provide an adequate self-regulation of pH. Polymer gel 22 functions as both sensor and actuator to regulate fluid flow without the need for external monitoring and control. The sensing and actuation functions are attributed to the use of a polymeric material that exhibits discontinuous volume changes in response to the chemical environment, i.e., pH, of the fluid stream. The change in volume of the polymer gel is illustrated in FIG. 3.

The pH sensor/actuator illustrated in FIG. 2 demonstrates one microscale device utilizing a functional polymer gel and one method of microfabricating the microscale device. However, the present invention is not limited to the above-described pH sensor/actuator. The method of the present invention is generic for the preparation of numerous other microscale devices having a preselected array of one or more microscale channels that can contain one or more polymer gels designed to perform a specific function, e.g., detect an analyte or a change in a physical property, or act as a valve or a pump.

In general, a microscale device of the present invention comprises (a) nonresponsive construction materials and (b) responsive materials. The responsive material can be a bioresponsive material and/or a physico/chemoresponsive material. The responsive material typically is a polymeric hydrogel. The responsive materials are prepared from monomers, and typically photopolymerizable monomers, and are integrated directly into the device as described above. The responsive materials typically are polymers prepared from multifunctional acrylates, hydroxyethyl-methacrylate (HEMA), elastomeric acrylates, and related monomers. The nonresponsive materials are used to define the walls of channels and form the structural components of permeable, semipermeable, and impermeable flexible barriers. Nonresponsive materials typically are prepared from hydrocarbon monomers, like dicyclopentadiene.

Physico/chemoresponsive materials are hydrogels that exhibit fast and substantial changes in volume as a function of various stimuli and are used to fabricate microscale components that regulate and/or monitor temperature, pH, ionic strength, the presence of a particular compound, and other environmental variables. Physico/chemoresponsive materials also are the basic building block for the preparation of a microscale component containing a bioresponsive material.

Bioresponsive materials typically comprise a synthetic hydrogel and a biomolecule. Bioresponsive materials are capable of exhibiting a volume change in the presence of toxins or pathogens, for example, and either can undergo volume changes multiple times in a reversible and repeatable fashion, or can be "one-shot" materials that undergo an irreversible volume change, depending upon the compositional makeup of the bioresponsive material.

Figure 4:
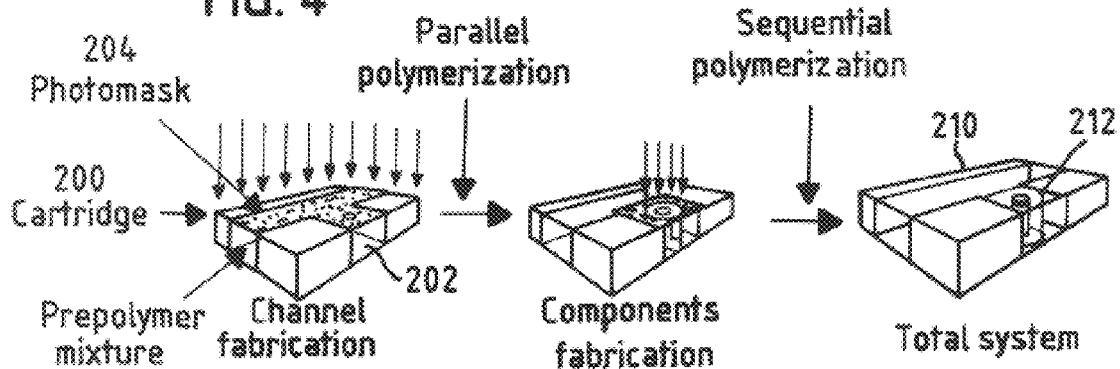
FIGS. 4 and 6 illustrate a method of manufacturing a microscale device of the present invention.

The manufacture of a microscale device of the present invention, i.e., a hydrogel jacket valve in a T-channel, is illustrated in FIGS. 4 and 6. In general, micromolding techniques are used to provide wide, shallow cartridges. Polymer components, both functional and structural, are created inside a cartridge via direct photopatterning of a liquid phase polymerizable mixture. Through the application of liquid phase polymerization, lithography, and laminar flow, all components of the device, including the nonresponsive microchannels, are easily constructed.

In a typical procedure illustrated in FIG. 4, a cartridge 200, for example, about 100 to 250 μm deep, and, independently, about 500 to 25,000 μm wide and long, is filled with a polymerizable mixture comprising monomers and a photoinitiator. The mixture is allowed to reach a quiescent state, then is exposed to UV light. A photomask 204 positioned on a top surface of cartridge 200 determines the geometry of the structural components of the device and of the microchannels. The polymerizable mixture that is not protected by photomask 204 polymerizes to form the nonfunctional structural material of the microscale device. Polymerization times are about 5 seconds to 10 minutes depending on the photoinitiator, monomer mixture, and light intensity. A convenient light source is a filtered light source from a standard fluorescence microscope.

When polymerization is complete, residual, unpolymerized polymerizable mixture is flushed from cartridge 200 to provide a channel 202. The unpolymerized mixture is flushed from the cartridge with a suitable solvent (e.g., water or methanol) to remove the unpolymerized mixture under the photomask. Multiple structures can be created simultaneously by using a photomask with a multistructure pattern, or by refilling the cartridge with another the portion of same, or a different, polymerizable mixture and repeating the polymerization in a sequential fashion. FIG. 4 shows a microscale device 210 having a microscale component 212 positioned in microchannel 202.

Structures that are close together (i.e., <300 μm) typically are not fabricated simultaneously because of a partial polymerization occurring between the objects, but sequential polymerization can be used to avoid this problem. This method allows polymer materials of different shapes and sizes, and of different chemical identity, to be integrated directly into microfluidic systems, as illustrated in FIG. 5.

FIG. 5 contains examples of various geometries of microchannels of a microscale device of the present invention. The structural material used to construct the microchannels illustrated in FIG. 5 was a mixture of isobornyl acrylate (IBA), 2,2-bis[p-2'-hydroxy-3'-methacryloxypropoxy) phenylene]-propane, or tetraethyleneglycol dimethacrylate (TeEGDMA), and IRGACURE® 651 as the photoinitiator. These and similar monomers are preferred because they have a low degree of shrinkage during polymerization, exhibit fast polymerization kinetics, and are excellent structural materials that are nonfunctional and nonresponsive to stimuli of interest. Typical polymerization times were about 5 to about 40 seconds.

Figure 5A:
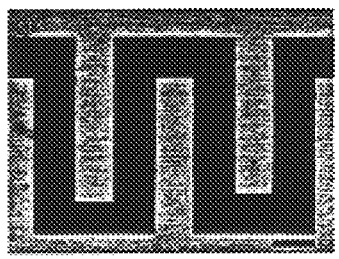
FIG. 5 illustrates examples of microchannel shapes for a microscale device of the present invention.
Figure 5B:
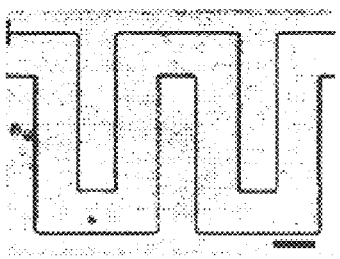
Figure 5C:
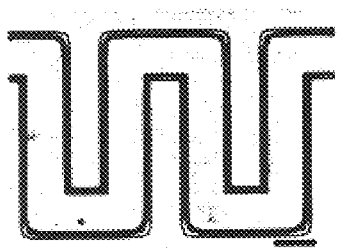

After UV exposure, the liquid polymerizable mixture is converted into a clear, rigid structural material. By a suitable selection of components in the polymerizable mixture, microchannels resistant to a variety of common solvents (e.g., water, ethanol, and acetone) can be prepared. In particular, FIG. 5a–c illustrate the basic steps in the preparation of a microchannel: (a) a photomask positioned on a top of the channel surface of a cartridge which determines the shape of the channel; (b) the microchannel after photopolymerization, (c) the channel after flushing with methanol to remove the unpolymerized monomer mixture.

Figure 5D:
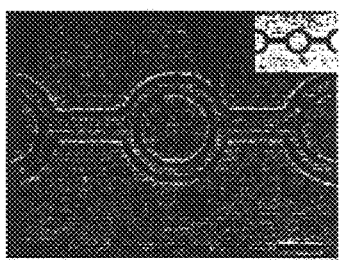
Figure 5E:
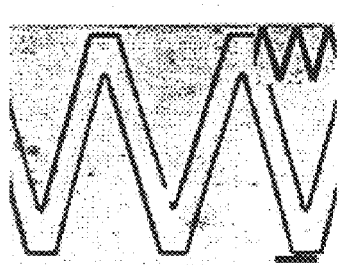
Figure 5F:
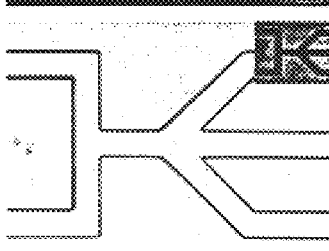

FIG. 5d–f illustrate a variety of microchannel geometries with the corresponding photomask shown at a reduced size in the upper right corner of each figure. Scale bars are 500 μm.

The present method allows the construction of all device structures and components, and, therefore, allows the total fabrication of a microscale device. For example, a predetermined array of microscale fluid channels in a substrate can be fabricated using any technique known to persons skilled in the art, e.g., etching or bonding of glass, or micromodeling or bonding of a polydimethylsiloxane. Next, a suitable polymerizable mixture is introduced into the channels. For example, the first step can be building the "walls" of the device on a substrate. In particular, the channels are filled with the appropriate polymerizable mixture, then the areas designated as walls are exposed to light, or other suitable energy source, to polymerize the monomers in the polymerizable mixture. The other areas of the channels are masked to prevent polymerization of the polymerizable mixture. Next, the remaining unreacted polymerizable mixture (i.e., the mixture under the mask) is rinsed from the channels. Then, a different polymerizable mixture can be introduced to the channels, and exposure of a preselected area to light, for example, forms a device component (e.g., a valve). The walls are prepared from a structural polymer, whereas a component is prepared from a functional polymer gel, i.e., a polymer that undergoes a change in response to a stimuli (e.g., heat, light, pH, or a biomolecule). This process can be repeated one or more times to manufacture additional device components comprising different functional polymer gels. Accordingly, an apparatus is envisioned wherein a substrate having a predetermined array of channels is introduced into the apparatus, then the apparatus is programmed to fabricate a customized microscale device. The present invention, therefore, provides a new process for manufacturing microscale devices useful in a variety of practical applications for microsystems. Additional embodiments of the present invention are described below.

Figure 6C:
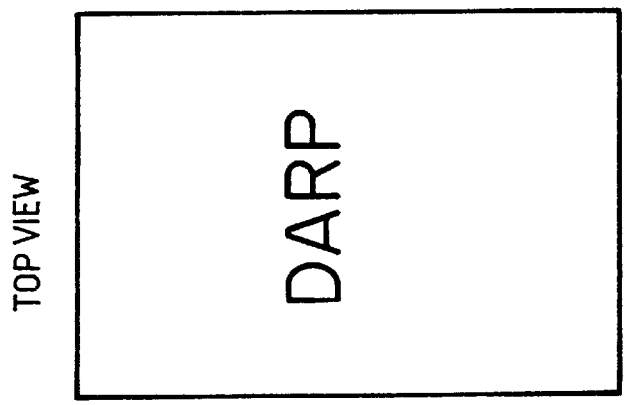

In another embodiment, a complex two-dimensional microscale device is manufactured using a large hele-shaw flow cell, which is a wide, shallow flow chamber, is provided. Next, the flow chamber is filled with a first polymerizable mixture. Typically, the first polymerizable mixture is nonfunctional structural material to manufacture device walls, for example. An optical mask is used to selectively expose preselected areas of the flow chamber to incident energy, like light, and polymerize the polymerizable mixture present at those areas. The remaining unreacted polymerizable mixture then is rinsed from the flow chamber. This process is repeated to add functional components (e.g., valves, sensors, and displays) to the device, as desired, using different polymerizable mixtures polymerized at different preselected areas in the flow chamber, as illustrated in FIG. 6a.

As discussed in more detail hereafter, fluid flow into the channels is laminar because of the microscale size of the fluid channels. Accordingly, three-dimensional functional devices can be prepared using the present method. In particular, rather than using a wide, shallow flow chamber, a flow channel having a relatively equal height-to-width ratio (e.g., an order of 1, or a square) is used. When using such a microscale channel, two or more different polymerizable mixtures can be introduced into a channel simultaneously or sequentially because fluid flow is laminar as opposed to turbulent. Alternatively, a polymerizable mixture and an inert liquid can be introduced into the chamber simultaneously or sequentially.

As used here and hereafter, the term "inert liquid" refers to a liquid that does not undergo a polymerization reaction when subjected to light or other polymerization-initiating energy source. The inert liquid, therefore, can be a solvent or carrier, like glycerin, or can be a liquid that carries a component to assist polymerization, like a polymerization catalyst, such as a transition metal metathesis-active catalyst for performing ring-open metathesis polymerization.

Laminar fluid flow at microscale combined with photopolymerization techniques allows the preparation of three-dimensional structures within microchannels. FIG. 6 illustrates a variety of geometric constructs made entirely by using laminar flow and photopolymerization, as illustrated in FIG. 6a. The device shown in FIG. 6a allows three fluid streams to be mixed. Two fluid streams 302 and 304 are controlled externally, while a third stream 306 is controlled automatically by a functional valve 308.

A device 300 illustrated in FIG. 6a is constructed from a substrate, e.g., a simple hele-shaw flow cell (i.e., a wide, shallow microfluidic channel). First, a nonfunctional (i.e., structural) polymerizable mixture is flowed into the cell and selective regions are exposed to ultraviolet light to form the channel walls and the unexposed regions are flushed to form channels 302, 304, and 306. Next, a second polymerizable mixture is flowed into the newly formed channels. This mixture, which provides a pH sensitive hydrogel 308 after polymerization, is exposed only where a pH sensitive valve is desired, and the unexposed polymerizable mixture is flushed from the channels. Finally, a passive chaotic advection mixer 310 is prepared downstream in channel 302.

To create the three-dimensional geometry of mixer 310, laminar flow is used to define the dimensions in the plane perpendicular to flow and lithographic processes are used to define the dimensions in the direction of flow.

Figure 6B:
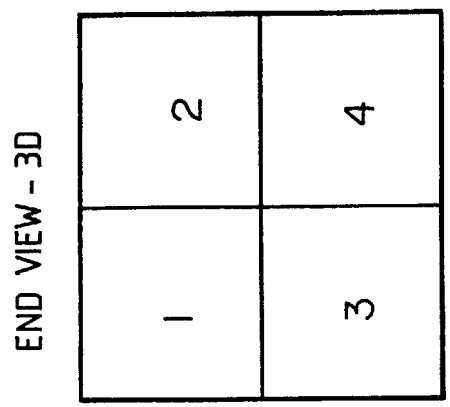
Figure 6A:
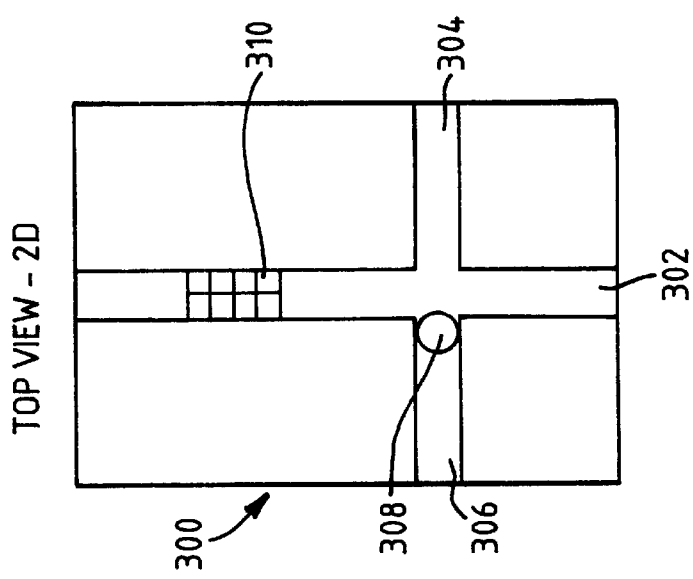
Figure 7A:
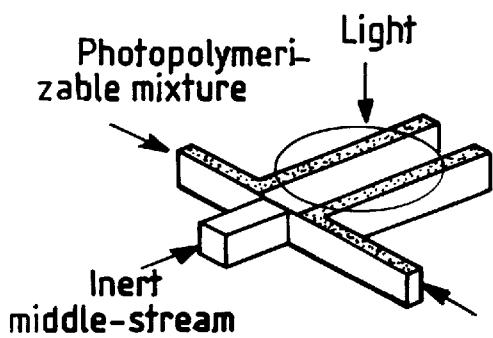
FIG. 7 illustrates the formation of functional hydrogels on the walls of a microchannel utilizing laminar flow.
Figure 7B:
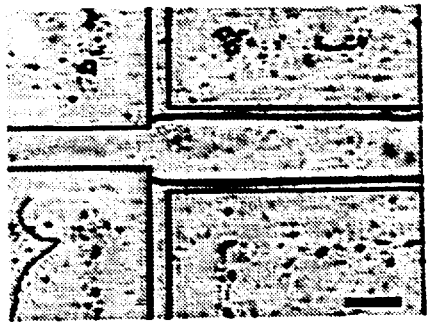
Figure 7C:
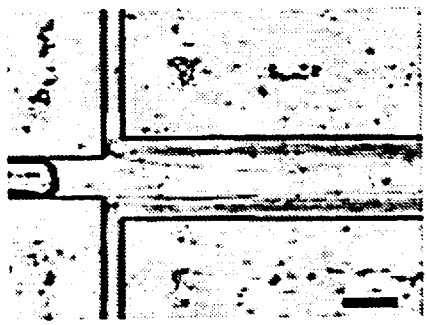
Figure 7D:
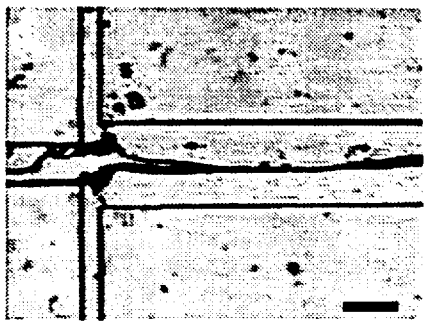

FIG. 6b illustrates a cross section of a microscale channel divided into four equal quadrants. A different polymerizable mixture or an inert liquid compound is introduced into each quadrant by laminar flow. The polymerizable mixtures polymerize in response to an exposure to a different wavelength of light, for example. Using an appropriate energy source, a filter, and a mask, it is possible selectively polymerize the mixtures in the different quadrants. The y-z plane defines the walls of the device and fluid interfaces between fluid streams, and the x dimension is defined by the masking. Alternatively, the device can be formed sequentially with only one quadrant containing the polymerizable mixture and others containing an inert liquid, e.g., glycerin. One example of a device fabricated by this method is a passive micromixer 310 of FIG. 6(a) in which each channel contains an obstacle fabricated from a different functional polymer, such that the mixing characteristics change in response to the temperature or pH of the solutions to be mixed. See R. H. Liu, *Journal of Microelectromechanical Systems,* submitted for publication, Apr. 1, 1999.

To construct mixer 310, a first polymerizable mixture fluidized in stream 1 (FIG. 6b) together with an inert fluid in streams 2, 3, and 4. This procedure is repeated to form a three-dimensional serpentine-like channel. The channel structure is functional (i.e., it expands and contracts in response to changes in pH) and is capable of adjusting the mixing performance in response to changes in the streams to be mixed (i.e., pH). Alternatively, the mixer structure can be formed by simultaneously using different polymerizable mixture that polymerize upon exposure to light of different wavelengths.

Another embodiment of the present invention uses hydrodynamic focusing to continuously manufacture small diameter polymeric threads. In this embodiment, a polymerizable mixture and an inert liquid are introduced into a microscale channel utilizing laminar flow. In particular, the laminar fluid stream has a cross section such that the polymerizable mixture is surrounded by the inert liquid, i.e., so-called "sheath flow" because the inert liquid forms a sheath around a core of the polymerizable mixture, for example. Through a suitable design of the fluid streams, a wide variety of threads of different cross section geometries can be formed, such as hollow, solid, multilayer, finned, and ribboned, for example. In addition, spheres or any particle shape that can be carried within a fluid stream can be positioned within the thread during manufacture. Either the thread and/or the bead can be manufactured from functional polymers.

In forming a thread, the polymerizable mixture, typically containing dicyclopentadiene or norborene, and inert liquid are allowed to continuously flow through the channel. Polymerization is effected at a preselected area of the channel, and a thread emerges from the channel. The process is adaptable to any material than can be carried in solution and solidified via some external stimuli (e.g., heat or light). The placement of objects in the thread can be controlled through the use of serial hydrodynamic focusing elements and the appropriate choice of fluid properties, such as density and viscosity, for example, and fluid velocities. The result of such a sheath flow is the preparation of a functional thread that can be woven into a fabric that responds to an external stimuli, i.e., a thread that expands or contracts in response to a pH change or a change in temperature.

Laminar flow, without photomasks, can be used to control microscale component geometry during fabrication microscale device, as illustrated in FIG. 7. In FIG. 7a, three fluid streams are pumped through a microchannel. The two outer streams contain functional polymerizable mixtures, while the middle stream comprises an inert fluid (FIG. 7a). For example, the outer streams of the polymerizable mixtures comprise, for example, acrylic acid, ethylene glycol dimethacrylate, water, and a photoinitiator. The middle inert stream can comprise glycerin. After a steady laminar flow is established using syringe pumps, the flow rates are gradually reduced to zero (FIG. 7b), followed by UV irradiation at the desired area to initiate polymerization. The result of polymerization is the formation of pH-sensitive hydrogels along the walls of the microchannels while the channel remains open (FIG. 5c). The functionalized walls can be used to regulate flow based on the pH of the fluid passing through the channel. When exposed to a basic solution (FIG. 7d), the pH-sensitive hydrogels expand to seal off the channel. Scale bars in FIG. 7 are 500 $\mu$m. Functional components made of different functional materials that are otherwise incompatible can be fabricated simultaneously using this method because the inert stream eliminates the necessity of direct contact between the two outer streams.

Figure 3A:
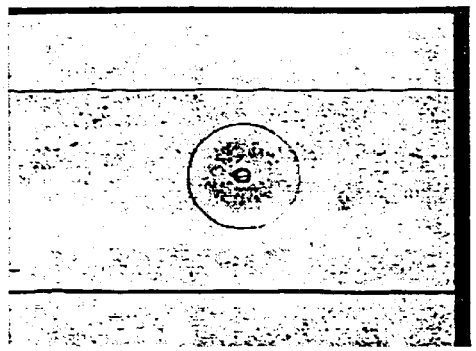
FIG. 3 illustrates the volume change of a microscale component in response to a change in pH.
Figure 3B:
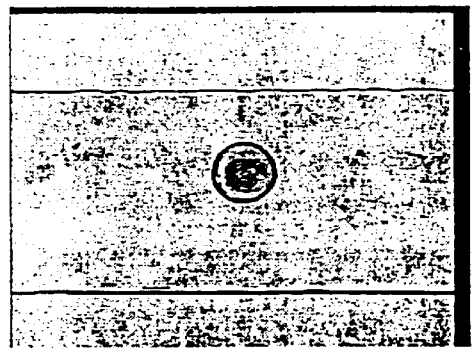

The preceding general discussion demonstrates the ability to utilize laminar flow in microscale channels, followed by photoinitiated polymerization at a preselected location in the channel, to provide functional microscale devices, like a pH sensor/actuator described above. In particular, FIG. 3 illustrates a circular polymer gel fabricated in a microscale channel via photoinitiated polymerization. In FIG. 3a, the polymer gel is expanded in acid, while in FIG. 3b, the polymer gel has contracted in a basic solution, thereby demonstrating pH sensitivity. Because of the small size of the pH sensor, the response to changes in pH, i.e., contraction and expansion, is rapid. The response also is reproducible.

An additional embodiment of the present invention includes writing with beam of light, wherein arbitrary two-dimensional shapes are formed by simply slowly moving a beam of light at an appropriate wavelength over a channel containing a polymerizable mixture, as illustrated in FIG. 6c. Another embodiment utilizes a selective surface treatment, wherein selectively patterning an initiator on a channel surface can be used to define polymerization patterns. The inventive method can be utilized to manufacture both the structural components, like walls and channels, and the functional components, like sensors, valves, and pumps, of a microscale device, without the need to assemble individual device components.

The following describes various features of the present invention in more detail and provides further specific examples of the present invention.

The substrate used in the present method is not limited, and can be any material of construction. If the substrate is monolithic, i.e., is a single component, the substrate is transparent to permit light to pass through the substrate and contact a polymerizable mixture in a microscale channel to effect polymerization. If the substrate comprises two or more substrate components secured together to form the substrate, at least one substrate component is transparent to permit photoinitiated polymerization to occur in the microscale channels. Nonlimiting examples of substrates include glass, a plastic, a transparent mineral, and similar substrates.

For example, the substrate can be silicon. When using such a substrate, silicon planar processing can be used for positioning electronic components, and the present invention can be used to position polymer gels over the electronic components to interface with the electronic components.

The channels present in the substrate are microscale in size. The substrate can contain one or a plurality of microscale channels depending upon the final end use application of the microscale device. The channels can be preformed in the substrate by methods well known in the art, such as lithography. Alternatively, the channels can be manufactured using the present invention. In this method, structural polymers are selectively produced at preselected locations on the substrate to provide the channel array of interest. Structural polymers typically are prepared from hydrocarbon monomers.

The channels are of microscale size such that fluid flow through the channels is laminar. This permits two or more liquids to flow through the channel simultaneously without mixing. Accordingly, the channels have a cross-section diameter of about 1 micron to about 1 millimeter, and preferably about 2 microns to about 500 microns. To achieve the full advantage of the present invention, the channels have a cross section diameter of about 5 microns to about 250 microns.

The polymerizable mixture introduced into the microscale channels is a liquid. In addition, the liquid has properties which permit flow in a laminar fashion. Liquids that flow in a laminar fashion, i.e., without turbulent mixing, allow multiple liquid streams to flow through the chamber simultaneously without mixing. Fluids flowing at microscale dimensions exhibit several differences from macroscale fluid flow. At a microscale channel size, turbulence does not exist and fluid flow is laminar. In laminar flow, it is possible to precisely control the simultaneous introduction of multiple fluid streams into a single channel. An example of laminar flow is sheath flow in a flow cytometry system where hydrodynamic focusing is used to precisely align cells in solution. Laminar flow also is discussed in P. J. Kenis et al., Science, 285 pp. 83–85 (1999).

Liquids capable of exhibiting laminar flow have a low Reynold's number (Re). The Reynold's number is related to the tendency of a flowing liquid to develop turbulence. The Reynold's number is defined as follows:

$$Re = \frac{vl\rho}{\mu}$$

wherein the lower the velocity (v, in ml/s) of the liquid flow, the channel diameter (l, in m), and liquid density ($\rho$, in kg/m$^3$), and the higher the liquid viscosity ($\mu$, in kg/ms), the lower the Re.

In general, laminar flow occurs in fluids having an Re less than about 2000. Turbulent flow occurs in fluids having an Re greater than 2000. Accordingly, a fluid used in the present invention, and introduced into a microscale channel, has a Reynolds number of about 1 to about 2000, and preferably about 2 to about 1000. To achieve the full advantage of the present invention, the fluid has an Re of about 5 to less than about 500, and especially less than about 100. Two or more different fluid streams simultaneously flowing in the same microsized channel, and having a low Re, do not develop turbulence, and the only method of mixing the fluid streams is diffusion at the fluid interface. Accordingly, separate flowing layers of low Re fluids can flow through a microscale channel simultaneously.

The fluid, or fluids, introduced into a microscale channel can be a polymerizable mixture or can be an inert liquid. A single fluid can be introduced into a channel, or more than one fluid can be introduced into a channel in a laminar flow. For example, two to five separate fluids can be introduced into the channel using laminar flow. When more than one fluid is introduced into a channel, at least one of the fluids is a polymerizable mixture. Any other combination of inert liquid and polymerizable mixture can be introduced into chamber. Typically, a polymerizable mixture is introduced such that the mixture contacts a surface of the channel, and the resulting polymer gel is adhered to the surface. However, in the manufacture of a thread, the polymerizable mixture can be introduced such that the mixture does not contact channel surfaces, i.e., is the core of a core/sheath flow.

An inert liquid flowing into the channel requires a low Re to provide laminar flow. The inert liquid also is incapable of being polymerized during a polymerization step. An inert liquid is introduced into the channel, for example, to act as a "spacer," i.e., to permit introduction of a desired thickness or cross section geometry of a polymerizable mixture in embodiments wherein the polymer gel thickness is less than the cross sectional dimension of the channel. After the polymerization step, the inert liquid is rinsed from the chamber. A nonlimiting example of an inert liquid is glycerin.

The polymerizable mixture flowing into the microscale channel is a liquid and also requires a low Re to provide laminar flow. The polymerizable mixture contains monomers capable of being polymerized when exposed to light or other polymer-initiating energy sources. The polymerizable mixture preferably contains a high percentage of monomers capable of photoinitiated polymerization. The mixture also can contain a photoinitiator. Most preferably, the polymerizable mixture is a neat mixture of monomers and photoinitiator, i.e., is free of a solvent. However, if a solvent is necessary to solubilize or disperse a solid monomer or photoinitiator, or to adjust a physical property of the polymerizable mixture, a solvent can be included in the polymerizable mixture. Typically, a solvent is present, if at all, in an amount of about 1% to about 25%, and preferably about 1% to about 10%, by weight, of the polymerizable mixture.

The solvent is not reactive when subjected to a polymerization-initiating energy source, and typically has a low molecular weight and a low boiling point. Nonlimiting examples of solvents include, but are not limited to, alcohols, like methanol and ethanol, ethers, aliphatic and aromatic hydrocarbons, ketones, like acetone, and water.

The monomers present in the polymerizable mixture typically include: (a) one or more monofunctional monomers, like monounsaturated ethylenic monomers, to provide the basic polymer structure, and (b) one or more polyunsaturated monomers which act as crosslinking agents. The polymerizable mixture can contain only polyunsaturated monomers as the monomer. The monomers are selected to provide a polymer gel having the desired physical and chemical properties to perform the end use for which the device is designed. The monomers, therefore, can possess one or more functional groups to impart functionality to the polymer gel, or the monomers can be nonfunctional to provide structures within the device, for example, in the preparation of channel walls, for example.

In particular, the monomers used to fabricate the functional polymer gel components typically exhibit a large physical change in response to minute chemical or biological stimuli. The gels bridge the macro-to-micro size gap to provide a large amplification of chemical/biological signals by directly coupling the signals to the physical macro-sized world. This feature eliminates the need for many typical system components (i.e., detection, spotting, separation), and can eliminate the need for many preparation steps to separate, isolate, purify analyte.

The monounsaturated ethylenic monomers can be substituted in order to provide a polymer having pendant acid groups or pendant basic groups. Likewise, the monomers can contain other types of substituents, like silicone groups, epoxy groups, hydroxy groups, amino groups, or a hydrolyzable group, like cyano groups. The polymerizable mixture can contain one monounsaturated monomer, or a plurality of comonomers, in order to provide a polymer gel having the desired chemical and physical properties to perform its intended function.

A polymer containing pendant acid groups can be either strongly or weakly acidic. The polymer can be a homopolymer or a copolymer. The acidic polymer typically is a lightly crosslinked acrylic-type polymer, such as lightly crosslinked polyacrylic acid. The lightly crosslinked acidic resin typically is prepared by polymerizing an acidic monomer containing an acyl moiety, e.g., acrylic acid or a salt thereof, or a moiety capable of providing an acid group, i.e., acrylonitrile, in the presence of a crosslinker, i.e., a polyunsaturated monomer. The acidic polymer can contain other copolymerizable units, i.e., other monoethylenically unsaturated comonomers free of an acidic substituent. An acidic polymer typically contains at least 10%, and more preferably, at least 25%, and up to 100%, acidic monomer units. The other copolymerizable units can, for example, help improve the hydrophilicity or hydrophobicity of the polymer gel. The acidic polymer can be neutralized from 0 to 100 mole % with a base, like sodium hydroxide, to provide a neutralized acidic polymer.

Generally, acidic polymers have pendant carboxyl, sulfonate, sulfate, or phosphate groups present along the polymer chain. Polymers containing such acidic moieties are synthesized from monomers previously substituted with one or more acidic substituents or by incorporating the acidic substituent into the polymer after synthesis. To incorporate carboxyl groups into a polymer, any of a number of ethylenically unsaturated carboxylic acids can be homopolymerized or copolymerized. Carboxyl groups also can be incorporated into the polymer chain indirectly by hydrolyzing homopolymers and copolymers of monomers such as acrylamide, acrylonitrile, methacrylamide, and alkyl (meth) acrylates.

Ethylenically unsaturated carboxylic acid and carboxylic acid anhydride monomers include, for example, acrylic acid, methacrylic acid, ethacrylic acid, α-chloroacrylic acid, α-cyanoacrylic acid, β-methylacrylic acid (crotonic acid), α-phenylacrylic acid, β-acryloxypropionic acid, sorbic acid, α-chlorosorbic acid, angelic acid, cinnamic acid, p-chlorocinnamic acid, β-stearylacrylic acid, itaconic acid, citraconic acid, mesaconic acid, glutaconic acid, aconitic acid, maleic acid, fumaric acid, tricarboxy ethylene, 2-methyl-2-butene dicarboxylic acid, maleamic acid, melamide, N-phenylmaleamide, maleic anhydride, fumaric anhydride, itaconic anhydride, citraconic anhydride, mesaconic anhydride, methyl itaconic anhydride, ethyl maleic anhydride, diethyl maleate, methyl maleate, maleic anhydride, and mixtures thereof.

Ethylenically unsaturated sulfonic acid monomers include aliphatic and aromatic vinyl sulfonic acids, such as vinyl sulfonic acid, allyl sulfonic acid, vinyl toluene sulfonic acid, styrene sulfonic acid, acrylic and methacrylic sulfonic acids, such as sulfoethyl acrylate, sulfoethyl methacrylate, sulfopropyl acrylate, sulfopropyl methacrylate, 2-hydroxy-3-methacryloxypropyl sulfonic acid, and 2-acrylamide-2-methylpropane sulfonic acid. A sulfonate-containing acidic polymer also can be prepared from monomers containing functional groups hydrolyzable to the sulfonic acid form, for example, alkenyl sulfonic acid compounds and sulfoalkylacrylate compounds.

Sulfate-containing acidic polymers are prepared by reacting homopolymers or copolymers containing hydroxyl groups or residual ethylenic unsaturation with sulfuric acid or sulfur trioxide. Examples of such treated polymers include sulfated polyvinyl alcohol, sulfated hydroxyethyl acrylate, and sulfated hydroxypropyl methacrylate. Phosphate-containing acidic resins are prepared by homopolymerizing or copolymerizing ethylenically unsaturated monomers containing a phosphoric acid moiety, such as methacryloxy ethyl phosphate.

Copolymerizable monomers for introduction into the acidic polymer include, but are not limited to, ethylene, propylene, isobutylene, $C_{1-16}$alkyl acrylates and methacrylates, vinyl acetate, methyl vinyl ether, and styrenic compounds having the formula

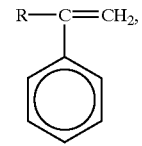

wherein R represents hydrogen or a $C_{1-6}$alkyl group, and wherein the phenyl ring is optionally substituted with one to four $C_{1-4}$alkyl or hydroxy groups.

Suitable alkyl acrylates and methacrylates include, but are not limited to, methyl (meth)acrylate, ethyl (meth)acrylate, isopropyl (meth)acrylate, n-propyl (meth)acrylate, n-butyl (meth)acrylate, and the like, and mixtures thereof. Additional examples of the alkyl (meth)acrylates include, but are not limited to, isobutyl, pentyl, isoamyl, hexyl, 2-ethylhexyl, cyclohexyl, decyl, isodecyl, benzyl, lauryl, isobornyl, octyl, and nonyl (meth)acrylates. Suitable sytrenic and vinyl compounds include, but are not limited to, styrene, α-methylstyrene, β-methylstyrene, p-methylstyrene, t-butylstyrene, vinyl benzoate, isopropenyl acetate, a halostyrene, isoprene, vinyl toluene, vinyl naphthalene, acrylonitrile, acrylamide, methacrylamide, methacrylonitrile, vinyl acetate, vinyl propionate, vinyl butyrate, vinyl stearate, isobutoxymethyl acrylamide, vinyl chloride, and the like, and mixtures thereof.

Analogous to the acidic polymer gel, a basic polymer gel can be strongly or weakly basic. The basic polymer can be a homopolymer or a copolymer. The strongly basic polymers typically are present in the hydroxide (OH) or bicarbonate ($HCO_3$) form.

A basic polymer gel typically is a lightly crosslinked acrylic-type resin, such as a poly(vinylamine). The basic polymer also can be a polyethylenimine, a poly(allylamine), a poly(allylguanidine), a poly(dimethyldiallylammonium hydroxide), a quaternized polystyrene derivative, such as

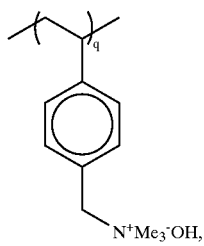

a guanidine-modified polystyrene, such as

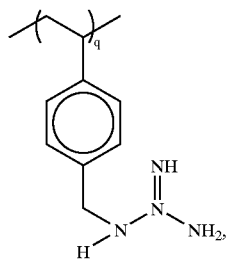

a quaternized poly((meth)acrylamide) or ester analog, such as

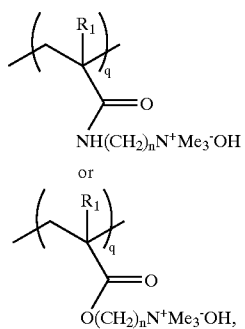

wherein Me is methyl, $R_1$ is hydrogen or methyl, n is a number 1 to 8, and q is a number 10 to about 100,000, or a poly(vinylguanidine), i.e., poly(VG), a strong basic polymer having the general structural formula

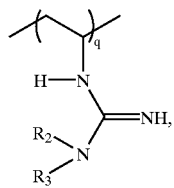

wherein q is a number 10 to about 100,000, and $R_2$ and $R_3$, independently, are selected from the group consisting of hydrogen, $C_1$–$C_4$ alkyl, $C_3$–$C_6$ cycloalkyl, benzyl, phenyl, alkyl-substituted phenyl, naphthyl, and similar aliphatic and aromatic groups. Like an acidic polymer gel, the basic polymer gel can contain other copolymerizable units and is crosslinked using a polyunsaturated monomer.

The monosaturated ethylenic monomer also can be a functionalized monomer, for example, a hydroxyalkyl (meth)acrylate, an aminoalkyl (meth)acrylate, or a glycidyl (meth)acrylate. Such monomers can be photopolymerized to provide polymers having functional pendant groups useful as is, or that can be derivatized by subsequent reactions to provide polymers that respond to a specific stimuli. For example, the polymer can be derivatized by attaching an antibody or a chemical or physical labeling group to the polymer.

An example of a class of functional monomers is a monomer containing a glycidyl group, like glycidyl (meth) acrylate. A monomer in this class can be any monomer having a carbon-carbon double bond and a glycidyl group. Typically, the monomer is a glycidyl ester of an α,β-unsaturated acid, or anhydride thereof. The α,β-unsaturated acid can be a monocarboxylic acid or a dicarboxylic acid. Examples of such carboxylic acids include, but are not limited to, acrylic acid, methacrylic acid, ethacrylic acid, α-chloroacrylic acid, β-cyanoacrylic acid, β-methylacrylic acid (crotonic acid), α-phenylacrylic acid, β-acryloxypropionic acid, sorbic acid, α-chlorosorbic acid, angelic acid, cinnamic acid, p-chlorocinnamic acid, β-stearylacrylic acid, itaconic acid, citraconic acid, mesaconic acid, glutaconic acid, aconitic acid, maleic acid, fumaric acid, tricarboxy ethylene, maleic anhydride, and mixtures thereof. Specific examples of monomers containing a glycidyl group are glycidyl (meth)acrylates (i.e., glycidyl methacrylate and glycidyl acrylate), mono- and di-glycidyl itaconate, mono- and di-glycidyl maleate, and mono- and di-glycidyl formate. Allyl glycidyl ether and vinyl glycidyl ether also can be used as a monounsaturated monomer in the method of the present invention.

In addition, the polymer gel can initially be a copolymer of an α,β-unsaturated acid and an alkyl (meth)acrylate, which then is reacted with a glycidyl halide or tosylate, e.g., glycidyl chloride, to position pendant glycidyl groups on the polymer gel. The α,β-unsaturated carboxylic acid can be an acid listed above, for example.

In an alternative embodiment, a polymer gel having pendant hydroxyl groups first is formed. The polymer then is reacted to position pendant glycidyl groups on the polymer. The polymer having pendant hydroxyl groups can be prepared by incorporating a monomer, like 2-hydroxyethyl methacrylate or 3-hydroxypropyl methacrylate, into the polymer gel.

A preferred monounsaturated monomer containing a glycidyl group is glycidyl (meth)acrylate having the following structure:

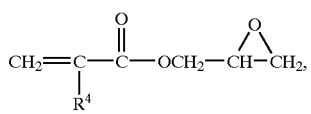

wherein $R^4$ is hydrogen or methyl.

Another example of a class of monomers containing a functional group are the hydroxy ($C_1$–$C_6$)alkyl (meth)acrylates, e.g., 2-hydroxyethyl methacrylate, 2-hydroxyethyl acrylate, 2-hydroxypropyl methacrylate, and 3-hydroxypropyl methacrylate.

The polymer gel initially can be a copolymer of an alkyl (meth)acrylate, which then is reacted with a glycol or polyol, e.g., ethylene glycol or propylene glycol, to position pendant hydroxy groups on the acrylate copolymer.

In an alternative embodiment, a polymer gel having pendant glycidyl groups first is formed. The polymer gel then is reacted with a reagent to open the glycidyl epoxy ring and position pendant hydroxy groups on the acrylate polymer. The acrylate copolymer having pendant glycidyl groups can be prepared by incorporating a monomer like glycidyl acrylate, glycidyl methacrylate, allyl glycidyl ether, or vinyl glycidyl ether into the polymer gel.

A preferred monounsaturated monomer containing a hydroxy group is a hydroxyalkyl (meth)acrylate having the following structure:

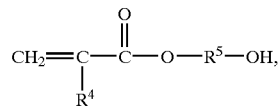

wherein $R^4$ is hydrogen or methyl, and $R^5$ is a $C_1$ to $C_6$ alkylene group or an arylene group. For example, $R^5$ can be, but is not limited to (—$CH_2$—)$_n$, wherein n is 1 to 6,

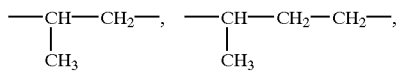

any other structural isomer of an alkylene group containing three to six carbon atoms, or a cyclic $C_3$–$C_6$ alkylene group. $R^5$ also can be an arylene group, like phenylene (i.e., $C_6H_4$) or naphthylene (i.e., $C_{10}H_6$). $R^5$ optionally can be substituted with substituents, like $C_1$–$C_6$ alkyl, halo, (i.e., Cl, Br, F, and I), phenyl, alkoxy, and aryloxy (i.e., an $OR^2$ substituent), for example.

An additional functional monomer has the structure:

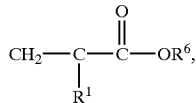

wherein $R^4$ is hydrogen or methyl, and $R^6$ is a substituted alkyl group containing one to sixteen carbon atoms. The $R^6$ group is substituted with one or more, and typically one to three, moieties such as halo, amino, phenyl, and alkoxy, for example. The structure, therefore, encompasses aminoalkyl (meth)acrylates. Most preferably, $R^1$ is methyl and $R^2$ is an amino-substituted alkyl group having two to four carbon atoms.

Additional functional monomers include the alkylated alkylol acrylamide monomers, which are derivatives of acrylamide, methacrylamide, methylol acrylamide, or similar alkyl modified acrylamide monomer as disclosed, for example, in U.S. Pat. Nos. 3,991,216; 4,097,438; and 4,305,859, incorporated herein by reference. The acrylamide monomers preferably are alkylated with an alkyl group, such as methyl, ethyl, propyl, n-butyl, or isobutyl, and similar alkylated alkylol acrylamide monomers.

The monomers useful in the present method are not limited to acrylate or vinyl-type monomers, but can include any other monounsaturated or polyunsaturated monomer that is photopolymerizable. Examples of other types of photopolymerizable monomers include, for example, an epoxy compound, including an epoxy functional silicone compound.

A wide variety of photopolymerizable monomers are known in the art, and include, for example, the various acrylic compounds and vinyl compounds disclosed above. Nonlimiting examples of other suitable classes of photopolymerizable monomers, used either alone or in monomer mixtures, include epoxysilicone compounds, epoxy compounds, polymerizable ether compounds, and polyhydroxy organic compounds.

Numerous photopolymerizable epoxysilicone compounds are available commercially. For example, epoxysilicones sold under the trade designations UV9400 and UV500A are available from the GE Silicones, Waterford, N.Y. UV9400 contains 80–99% by weight of dimethyl, methyl, 2-(7-oxabicyclo(4.1.0) hept-3-yl)ethyl silicone having (dimethyl (2-(7-oxabicyclo(4.1.0)hept-3-yl)ethylsilyl)-oxy) terminal groups. UV500A contains about 10–30 percent by weight dimethyl, methyl, 2-(7-oxabicyclo(4.1.0)hept-3-yl)ethyl silicone having (dimethyl (2-(7-oxabicyclo(4.1.0) hept-3-yl) ethylsilyl)-oxy) terminal groups. The epoxysilicone in UV9400 and UV500A has a CAS No. 150678-61-8. UV9300 is another suitable epoxysilicone (containing 80–99% by weight dimethyl, methyl, 2-(7-oxabicyclo(4.1.0) hept-3-yl)ethyl) silicone (CAS No. 67762-95-2), also available from General Electric.

Additional epoxy-functional silicone compounds are available from the General Electric Co. under the trade designations UV9315 and UV9320. UV9315 contains 80–99% by weight dimethyl, methyl, 2-(7-oxabicyclo(4.1.0) hept-3-yl)ethyl silicone having dimethyl (2-(7-oxabicyclo (4.1.0)hept-3-yl)ethylsilyl)-oxy terminal groups (CAS No. 150678-61-8). UV9320 contains 80–99% by weight (2-hydroxy-phenyl)propyl, trimethyl-heptyl-3-yl)ethyl, methyl-3-methyl-2-(7-oxabicyclo(4.1.0)hept-3-yl) ethylsilyl)-oxy) silicone having dimethyl siloxy terminal groups (CAS No. 130885-21-1).

Other photopolymerizable silicone compounds are available from Genesee Polymers Corporation of Flint, Mich. For example, photopolymerizable silicone compounds are sold under the trade designations EXP-29 and EXP-32 silicone fluids. EXP-29 is an epoxy-functional dimethylpolysiloxane copolymer having a molecular weight of about 5700 and the structure:

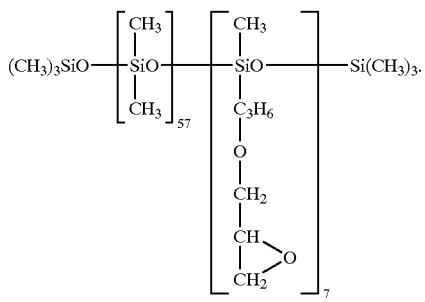

EXP-32 also is an epoxy functional dimethylpolysiloxane copolymer fluid having a molecular weight of about 8300 and the structure:

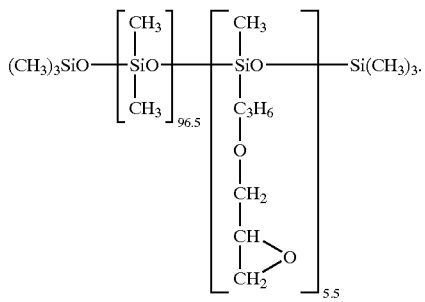

Additional epoxysilicone compounds are described in Koshar et al. U.S. Pat. No. 4,313,988, incorporated herein by reference.

Further photopolymerizable monomers include a product available from Union Carbide under the trade designation UVR-6110. UVR-6110 contains the difunctional epoxy compound, 3,4-epoxycyclohexylmethyl-3,4-epoxycyclohexane carboxylate. Other epoxy compounds that can be included in the polymerizable mixture are, for example, bis(3,4-epoxycyclohexylmethyl)adipate, 2-(3,4-epoxycyclohexyl-5.5-spiro-3,4-epoxy)cyclohexane-metaldioxane, a diglycidyl ether of phthalic acid, a diglycidyl ether of hexahydrophthalic acid, a diglycidyl ether of bisphenol A, a cresol-novolac epoxy resin, other difunctional and multifunctional epoxy compounds, and mixtures thereof. Monoepoxy compounds, like a $C_8$–$C_{18}$ alkylglycidyl ether, also can be used in the polymerizable mixture.

Preferred monomers for use in a pH sensor/actuator include, but are not limited to, acrylic acid, butyl methacrylate, 2-(dimethyl-amino)ethyl methacrylate, 2-hydroxyethyl methacrylate, hydroxypropyl methacrylate, methacrylic acid, methyl methacrylate, and ethylene glycol dimethacrylate.

Polymerization of the unsaturated ethylenic monomers, including acidic or basic monomers, or other functional monomers, and optional copolymerizable monomers, typically is performed by free radical processes in the presence of a polymerizable crosslinker, conventionally a polyunsaturated organic compound. The polymers are crosslinked to a sufficient extent such that the polymer is an insoluble gel. For use in many applications, a polymer gel is lightly crosslinked, i.e., has a crosslinking density of less than about 20%, preferably less than about 10%, and most preferably about 0.01% to about 7%, which allows the polymer gel to expand and contract.

A polymerizable crosslinker most preferably is used in an amount of less than about 7 wt %, and typically about 0.1 wt % to about 5 wt %, based on the total weight of monomers. Examples of crosslinking polyvinyl monomers include, but are not limited to, polyacrylic (or polymethacrylic) acid esters represented by the following formula (I); and bisacrylamides, represented by the following formula (II).

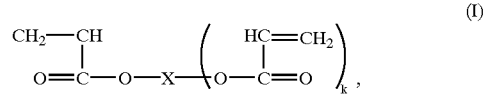

wherein X is ethylene, propylene, trimethylene, cyclohexyl, hexamethylene, 2-hydroxypropylene, —($CH_2CH_2O$)$_p$$CH_2CH_2$—, or

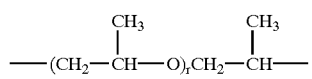

p and r are each an integer 5 to 40, and k is 1 or 2;

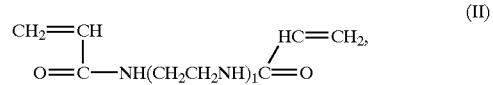

wherein l is 2 or 3.

The compounds of formula (I) are prepared by reacting polyols, such as ethylene glycol, propylene glycol, trimethylolpropane, 1,6-hexanediol, glycerin, pentaerythritol, polyethylene glycol, or polypropylene glycol, with acrylic acid or methacrylic acid. The compounds of formula (II) are obtained by reacting polyalkylene polyamines, such as diethylenetriamine and triethylenetetramine, with acrylic acid.

Specific crosslinking monomers include, but are not limited to, 1,4-butanediol diacrylate, 1,4-butanediol dimethacrylate, 1,3-butylene glycol diacrylate, 1,3-butylene glycol dimethacrylate, diethylene glycol diacrylate, diethylene glycol dimethacrylate, ethoxylated bisphenol A diacrylate, ethoxylated bisphenol A dimethacrylate, ethylene glycol dimethacrylate, 1,6-hexanediol diacrylate, 1,6-hexanediol dimethacrylate, neopentyl glycol dimethacrylate, polyethylene glycol diacrylate, polyethylene glycol dimethacrylate, triethylene glycol diacrylate, triethylene glycol dimethacrylate, tripropylene glycol diacrylate, tetraethylene glycol diacrylate, tetraethylene glycol dimethacrylate, dipentaerythritol pentaacrylate, pentaerythritol tetraacrylate, pentaerythritol triacrylate, trimethylolpropane triacrylate, trimethylolpropane trimethacrylate, tris(2-hydroxyethyl)isocyanurate triacrylate, tris(2-hydroxyethy)isocyanurate trimethacrylate, divinyl esters of a polycarboxylic acid, diallyl esters or a polycarboxylic acid, triallyl terephthalate, diallyl maleate, diallyl fumarate, hexamethylenebismaleimide, trivinyl trimellitate, divinyl adipate, diallyl succinate, a divinyl ether of ethylene glycol, cyclopentadiene diacrylate, tetraallyl ammonium halides, or mixtures thereof. Compounds such as divinylbenzene and divinyl ether also can be used to crosslink the poly(dialkylaminoalkyl acrylamides). Especially preferred crosslinking agents are N,N'-methylenebisacrylamide, N,N'-methylenebismethacrylamide, ethylene glycol dimethacrylate, and trimethylolpropane triacrylate.

In addition to the polymerizable monomers, the polymerizable mixture contains a photoinitiator, which facilitates polymerization when the polymerizable mixture is exposed to light. Alternatively, the photoinitiator can be adhered to a surface of a microscale channel at the position preselected for forming the polymer gel.

The photoinitiator is not limited, except that the initiator must be functional at the wavelength used to effect polymerization. The photoinitiator can be organic or inorganic in nature, and can be useful in aqueous or organic solvent-based polymerization mixtures. The photoinitiator is present in the polymerizable mixture in a sufficient amount to facilitate light or radiant energy-induced polymerization, i.e., about 0.1% to about 5%, by weight, based on the total weight of monomers in the polymerizable mixture.

A photoinitiator is a compound that absorbs energy, either directly or indirectly, from a photon and subsequently initiates polymerization. In particular, photoinitiators absorb light in the UV-visible spectral range (i.e., 250 to 450 nm) and convert this light energy into chemical energy in the form of reactive intermediates, such as free radicals or reactive cations, which subsequently initiate polymerization of monomers.

Photoinitiators for free radical UV curing are divided into two classes, namely Type I and Type II initiators. Upon irradiation, Type I initiators undergo fragmentation to yield initiating radicals. The majority of Type I initiators are aromatic carbonyl compounds containing suitable substituents that facilitate direct photofragmentation. Type II initiators mainly undergo two reaction pathways, hydrogen abstraction by the excited initiator, and photoinduced electron transfer, followed by fragmentation.

Type I photoinitiators include benzoin derivatives, notably benzoin ethers; benzil derivatives, like benzilketals, including 2,2-dimethoxy-2-phenylacetophenone (DMPA), α-hydroxyalkylphenones, like 2-hydroxy-2-methyl-1-phenylpropan-1-one (HMPP) and 1-hydroxy-cyclohexyl-phenylketone (HCPK); α-aminoalkylphenones; and acylphosphinoxides. Type II photoinitiators include aromatic ketones (e.g., benzophenone, substituted benzophenones, benzils, fluorenone, xanthone, thioxanthones), with performance being enhanced by the use of a tertiary amine synergists, like alkanolamines (e.g., triethanolamine, N,N-dimethylethanolamine, and N-methyldiethanolamine), and derivatives of a p-N,N-dimethylaminobenzoic acid. One class of amines is aliphatic amines and the other class is aromatic amines. Aliphatic amines are transparent down to 260 nm and consequently an amine can use light from the UV lamp down to 260 nm. The aromatic amines display strong absorption around 300 nm and consequently screen much of the UV light. Examples of Type II photoinitiators are the benzophenone-amines and thioxanthone-amines.

Specific examples of Type I photoinitiators include, but are not limited to, α-alkoxy-deoxybenzoins, α,α-dialkyloxydeoxybenzoins, α,α-dialkoxyacetophenones, α,α-hydroxyalkylphenones, O-acyl α-oximinoketones, dibenzoyl disulphide, S-phenyl thiobenzoates, acylphosphine oxides, dibenzoylmethanes, phenylazo-4-diphenylsulphone, 4-morpholino-α-dialkylaminoacetophenones, and mixtures thereof. Specific examples of Type II photoinitiators include, but are not limited to, benzophenones, camphorquinone, fluorenones, xanthones, benzils, α-ketocoumarins, anthraquinones, terephthalophenones, and mixtures thereof.

Water-soluble photoinitiators utilized in the polymerization of vinyl-type monomers include unimolecular photoinitiators, such as peroxides, which show absorption in the 200–300 nm region, like hydrogen peroxide, peroxydisulphate, and peroxydiphosphate; alkylazo compounds, like azoisobutyramide, α,α'-azobis(2-amidino) propane hydrochloride, and 4,4'-azobis(4-cyanovaleric); carbonyl compounds, like alkylphenones, such as 4-substituted (2-hydroxy-2-propyl)phenyl ketones and benzoylmethyl thiosulphates; α-dicarbonyl compounds, like solvated 2,3-butanedione; phosphines, like acylphosphine oxides and acylphosphonates, such as lithium and magnesium phenyl-2,4,6-trimethylbenzoylphosphinates; and copper (II) complexes, like copper(II)-bis(aminoacid)chelates with various amino acids (e.g., glutamic acid, serine, or valine).

Bimolecular water-soluble photoinitiators include coordination complexes, like iron (III), cobalt (III), and chromium (VI) complexes, such as trinuclear transition metal complexes; carbonyl compounds, like aromatic carbonyl compounds, such as benzophenone or thioxanthone derivatives in the presence of aliphatic amines as hydrogen donors, which have been made water soluble by attaching ionic groups, such as trimethylammonium or sulphonates; aromatic hydrocarbons, like pyrene; and dye-sensitized systems, which comprise a dye and a reducing agent such as an amine, sulphinate, phosphine, enolate, α-aminosulfone, or carboxylte.

Another class of photoinitiators is cationic initiators, which are compounds that under the influence of UV or visible radiation lead to the release of an acid, which in turn catalyzes the desired polymerization process. Cationic photoinitiators include diazonium salts, iodonium salts, and sulfonium salts.

Specific examples of photoinitiators include, but are not limited to benzophenone; 4,4'-bis(N,N'-dimethylamino) benzophenone (Michler's ketone); α,α-dimethyl-α-hydroxyacetophenone; 1-phenyl-1,2-propanedione, 2-(O-benzoyl)oxime; 4-phenylbenzophenone; benzil; (1-hydroxycyclohexyl)phenylmethanone; diphenyl(2,4,6-trimethylbenzoyl)phosphine phosphine oxide; xanthone; thioxanthone; 2-chlorothioxanthone; 9,10-phenanthraquinone; benzoin ethers (e.g., methyl, ethyl, or isobtyl); α-dimethylamino-α-ethyl-α-benzyl-3,5-dimethyl-4-morpholinoacetophenone; α,α-dimethoxy-α-phenylacetophenone; 9,10-anthraquinone; and α,α-diethoxyacetophenone.

Additional examples of photoinitiators include, but are not limited to, iodonium salts and sulfonium salts. The anion of these salts is not limited, but preferably is a complex anion containing Group Va or VIa elements. Exemplary, but nonlimiting, elements present in the anions are, for example: boron, phosphorus, antimony, arsenic, and tin. Nonlimiting examples of suitable nonbasic, nonnucleophilic anions include, but are not limited to: $BF_4^-$, $PF_6^-$, $AsF_6^-$, $SbF^{6-}$, $SnCl_6^-$, $SbCl_6^-$, $BiCl_5^{-2}$, $ClO_4^-$, $HSO_4^-$, $ZrF_6^{-2}$, $GaCl_4^-$, $InF_4^-$, $TiF_6^{-2}$, $AlF_6^{-2}$ and $FeCl_4^{-2}$.

Nonlimiting examples of particular sulfonium salt photoinitiators include the triaryl sulfonium complex salts, such as phenoxyphenyl sulfonium hexafluorophosphate; trifluoromethyl diphenyl sulfonium tetrafluoroborate; triphenyl sulfonium tetrafluoroborate, methyl diphenyl sulfonium tetrafluoroborate, dimethyl phenyl sulfonium hexafluoroborate, triphenyl sulfonium hexafluorophosphate, triphenyl sulfonium hexafluoroantimonate, diphenyl naphthyl sulfonium hexafluoroarsenate, tritolyl sulfonium hexafluorophosphate, anisyl diphenyl sulfonium hexafluoroantimonate, 4-butoxyphenyl diphenyl sulfonium tetrafluoroborate, 4-chlorophenyl diphenyl sulfonium hexafluorophosphate, tri(4-phenoxyphenyl) sulfonium hexafluorophosphate, di(4-ethoxyphenyl) methyl sulfonium hexafluoroarsenate, 4-acetonylphenyl diphenyl sulfonium tetrafluoroborate, 4-thiomethoxyphenyl diphenyl sulfonium hexafluorophosphate, di(methoxysulfonylphenyl) methyl sulfonium hexafluoroantimonate, di(nitrophenyl) phenyl sulfonium hexafluoroantimonate, di(carbomethoxyphenyl) methyl sulfonium hexafluorophosphate, 4-acetamidophenyl diphenyl sulfonium tetrafluoroborate, p-(phenylthiophenyl) diphenyl sulfonium hexafluoroantimonate, 10-methylphenoxathiinium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 5-methyl-10-oxothianthrenium tetrafluoroborate, 5-methyl-10,10-dioxothianthrenium hexafluorophosphate, dimethyl naphthyl sulfonium hexafluorophosphate, and mixtures thereof. Bis-type sulfonium salt photoinitiators, such as bis-(4-(diphenylsulfonio) phenyl)sulfide bis-hexafluorophosphate, for example, also can be used.

Many sulfonium salt photoinitiators are available commercially. For example, a preferred sulfonium salt initiator is available under the trade name CYRACURE UVI-6974 from Union Carbide Corporation of Danbury, Conn. CYRACURE UVI-6974 contains a mixture of triaryl sulfonium hexafluoroantimonate salts having CAS Nos. 89452-37-9 and 71449-78-0, and is sold as a 50 wt. % solution in propylene carbonate. CAS No. 89452-37-9 is (thiodi-4,1-phenylene) bis(diphenyl-sulfonium) hexafluoroantimonate. CAS No. 71449-78-0 is diphenyl(4-phenylthiophenyl) sulfonium hexafluoroantimonate. Another suitable sulfonium photoinitiator available from Union Carbide Corporation is CYRACURE UVI-6990. UVI-6990 contains triaryl sulfonium hexafluorophosphate salts having CAS Nos. 74227-35-3 and 68156-13-8, and is sold as a 50% solution in propylene carbonate. CAS No. 74227-35-3 is bis(4-(diphenylsulfonio)phenyl) sulfide bis-(hexafluorophosphate). CAS Nos. 68156-13-8 is diphenyl phenylthiophenyl sulfonium hexafluorophosphate.

Nonlimiting examples of useful iodonium salt initiators include the aryl iodonium salts, such as diphenyliodonium tetrafluoroborate, di(2,4-dichlorophenyl)iodonium hexafluorophosphate, diphenyliodonium hexafluorophosphate, diphenyliodonium hexafluoroarsenate, diphenyliodonium iodide, diphenyliodonium hexafluoroantimonate, 4-chlorophenylphenyliodonium tetrafluoroborate, di(4-chlorophenyl)iodonium hexafluoroantimonate diphenyliodonium hexafluorophosphate, diphenyliodonium trifluoroacetate, 4-trifluoromethylphenylphenyliodonium tetrafluoroborate, ditolyliodonium hexafluorophosphate, di(4-methoxyphenyl) iodonium hexafluoroantimonate, di(4-methoxyphenyl)-iodonium chloride, (4-methylphenyl) phenyliodonium tetrafluoroborate, di-(2,4-diethylphenyl) iodonium hexafluoroantimonate, di-(4-t-butylphenyl) iodonium hexafluoroantimonate, 2,2'-diphenyliodonium hexafluorophosphate, di(4-methylphenyl)iodonium tetrafluoroborate, di-(4-heptyiphenyl)iodonium tetrafluoroborate, di(3-nitrophenyl)iodoniun hexafluorophosphate, di(4-chlorophenyl)iodonium hexafluorophsphate, di(naphthyl)iodonium tetrafluoroborate, di(4-trifluoromethylphenyl)iodonium tetrafluoroborate, di(4-methylphenyl)iodonium hexafluorophosphate, diphenyliodonium hexafluoroarsenate, di(4-phenoxyphenyl) iodonium tetrafluoroborate, diphenyliodonium hexachlorostannate, phenyl-2-thienyliodonium hexafluorophosphate, diphenyliodonium hexafluorostannate, 2,2'-diphenyliodonium tetrafluoroborate, di(2,4-dichlorophenyl)iodonium hexafluorophosphate, di(4-bromophenyl)iodonium hexafluorophosphate, di(4-methoxyphenyl)iodonium hexafluorophosphate, di(3-carboxyphenyl)iodonium hexafluorophosphate, di(3-methoxycarbonylphenyl) iodonium hexafluorophosphate, di(3-methoxysulfonylphenyl)iodonium hexafluorophosphate, di(4-acetamidophenyl)iodonium hexafluorophosphate, di(2-benzothienyl)iodonium hexafluorophosphate, bis(4-dodecylphenyl)iodonium hexafluoroantimonate, bis(4-dodecylphenyl) iodonium hexafluoroarsenate, and mixtures thereof.

Many iodonium salt initiators are also available commercially. An iodonium salt is available from the General Electric Co., New York under the trade designation UV9380C. UV9380C contains about 30% to about 60% by weight bis(4-dodecylphenyl)iodonium hexafluoroantimonate (CAS No. 71786-70-4). Other components of UV9380C are 2-isopropyl thioxanthone, $C_{12}$ and $C_{14}$ alkyl glycidyl ethers (about 30% to about 60% by weight), and linear alkylate dodecylbenzene. The $C_{12}$ and $C_{14}$ alkyl glycidyl ethers are monoepoxy compounds and can be considered photopolymerizable monomers.

Another iodonium salt is available from the General Electric Co. under the trade designation UV9310C. The active initiator component of UV9310C is about 30 to about 60 weight percent bis(4-dodecylphenyl)iodonium hexafluoroantimonate (CAS No. 71786-70-4). Other components of UV9310C are 2-ethyl-1,3-hexanediol (about 30–60 weight percent) and a linear alkylate dodecylbenzene (about 5–10 weight percent). The 2-ethyl-1,3-hexanediol present in UV9310C is a polyhydroxy compound capable of reacting with the epoxy functionalities and can be considered as a photopolymerizable monomer.

Other examples of sulfonium salt and iodonium salt photoinitiators are found, for example, in Guarnery et al. U.S. Pat. No. 4,250,006; Schlesinger U.S. Pat. No. 4,287,228; and Smith U.S. Pat. No. 4,250,053, the disclosures of which are hereby incorporated herein by reference.

The polymerizable mixture, and the polymer gels prepared therefrom, can, if desired, include optional additives, such as dyes, fillers, pigments, flow agents, thickeners, thixotropic agents, surface active agents, viscosity modifiers, plasticizers, and similar additives known to persons skilled in the art to modify a physical or functional property of the polymerizable mixture or polymer gel. These optional ingredients are included in the polymerizable mixture in an amount sufficient to perform their intended purpose, typically in amounts of 0.01 part to 5 parts, by weight, per 100 weight parts of the polymerizable mixture.

The polymerizable mixture is introduced into a microscale channel utilizing laminar flow such that, if desired, more than one fluid stream can be introduced into the channel simultaneously or sequentially, without mixing of the fluid streams. The channel is optically masked except for the preselected location of the channel where polymerization is desired. Sufficient energy to effect polymerization, like light of the proper wavelength, is directed at the preselected location for a sufficient time to polymerize the monomers in the mixture, typically about 20 seconds to about 5 minutes. The unreacted polymerizable mixture present at the masked locations of the channel then are flushed from the channel, leaving a polymer gel at the preselected location in the channel. The polymer gel can occupy the entire cross section of the channel, or a fraction of the cross section.

Microchannel surfaces can vary in polarity from hydrophobic to hydrophilic. Surface modification is important for wetting, adhesion, biological response, and for the constructions of hydrophobic vents. This can be easily accomplished, for example, by using various substituted acrylates (e.g., perfluoroacrylates). For devices that require spatially varying surface chemistries, in situ methods to surface graft hydrogels can be used.

For example, a polymer is adhered to a surface of the channel by applying an anchoring material to the surface of the channel at a preselected location in the channel. The optional anchoring material serves to position the polymer gel at the preselected location in the channel, and helps ensure that the polymer gel is not moved by a flowing fluid during subsequent manufacturing steps, or during use of the device.

The optional anchoring material can be in the form of a thin layer of a material on a channel surface that adheres to the polymer gel and maintains the polymer gel at the preselected location in the channel. In another embodiment, the anchoring material is in the form of a post manufactured from a structural material, and positioned in the microscale channel at the preselected location for the polymer gel. The post typically is a hard, nonfunctional plastic or metal material, and the functional, responsive polymeric hydrogel is prepared to surround the post. Another method of anchoring the polymer gel is to provide a microscale channel having a reduced cross sectional diameter at the preselected location for the polymer gel. In this embodiment, the walls of the channel physically hold the polymer gel at the desired preselected location. Persons skilled in the art are capable of selecting other anchoring materials and designing channels to inhibit movement of microscale components in the device during manufacture or use.

A microscale component prepared in a channel has a diameter-to-height ratio, i.e., an aspect ratio, of about 10 to 1 to about 0.5 to 1, and preferably at 5 to 1 to about 0.5 to 1. To achieve the full advantage of the present invention, the polymer gel, or microscale component, has an aspect ratio of about 2 to 1 to about 0.5 to 1. Components having a low aspect ratio, coupled with the small size of the component, provide a rapid component response to a stimulus.

In addition to modifying the geometry of the hydrogel objects, porosity can be introduced to the hydrogel structure to increase the rate of fluid diffusion and hydrogel expansion or contraction. The introduction of porosity is achieved by adding surfactant and water to the polymerizable mixture. It has been theorized that surfactant micelle formation leads to the porous hydrogel structure during polymerization. It is observed that by introducing porosity, the response time for both hydrogel expansion and contraction improves more than ten-fold.

In addition, the polymer gel, or the microscale component, in the channel can be used as is to perform its intended function, or the polymer gel can be derivatized to perform a desired function. For example, antibodies can be bound to the surface of the polymer gel to perform immunological assays. In addition, functional groups on the polymer gel can be altered chemically such that the polymer can selectively detect or measure an analyte or physical property of interest.

For example, a hydrogel can be derivatized to provide a bioresponsive microscale device. Many extremely sensitive and elegant natural mechanisms detect and respond to a variety of different foreign or damaging substances in the body. While cell and tissue biosensing approaches are being investigated, interfacing between a cell/tissue response and a macroscale detection is nontrivial and involves the development of complex analytical techniques. A microscale device of the present invention that utilizes a bioresponsive hydrogel provides a new and effective cell/tissue biosensor, while avoiding many of the disadvantages inherent in current approaches. By integrating biomolecules into or onto the surface of a hydrogel, selective and sensitive sensors that directly bridge the nano-to-macro scale can be produced. The bioresponsive hydrogels are capable of a highly sensitive detection of a variety of toxins and pathogens, for example.

In general, hydrogels forming a microscale device are three-dimensional networks of hydrophilic polymers capable of absorbing large amounts of a fluid to form a swollen elastic gel. To maintain the three-dimensional structures, the polymer chains of hydrogels are crosslinked, either chemically through covalent bonds or physically through noncovalent interactions, such as hydrogen-bonding and ionic interactions. The hydrogels of interest are those that possess, in addition to expansion and contraction properties, the ability to respond in a defined manner to an external stimulus, like pH, temperature, electric field, ionic strength, light, pressure, or an antigen or other chemical agent.

Such stimuli-responsive hydrogels have been termed smart, or intelligent, hydrogels, and have wide applications in controlled drug delivery, biomedical diagnostic devices, and separation and purification technology. However, a slow time response has limited their use in many applications. By scaling the hydrogel to the microscale, this disadvantage is overcome, thereby making hydrogels ideal for use in microfluidic devices for detecting biological and chemical agents. The ability of a microscale stimulus to trigger a large physical change eliminates several problems that limit the utility of other detection devices. For example, bioresponsive hydrogels can be developed using known biomolecular mechanisms of pathogen and toxin response to create a class of smart hydrogels having biorecognition coupled to a fast and detectable volume change.

By incorporating a suitable biomolecule into a hydrogel, specificity for a particular biological or chemical agent is achieved. To illustrate this approach, hydrogels responding by three different modes of biological and chemical action have been developed. In particular, the current strong interest in the estrogen receptor (ER) in medical and environmental health research derives from the role of the receptor as a central point for signal transduction. Numerous naturally occurring and synthetic chemicals can bind to the large hydrophobic ligand binding pocket of the ER, and elicit estrogenic and/or antiestrogenic effects. These ligands, including antagonists, can operate by an active mechanism, not only blocking binding of the natural hormone estradiol ($E_2$), but also changing ER conformation, resulting in different downstream events. Studies confirm that ligand induced changes in ER conformation modulate ER interactions with coactivator proteins, which ultimately lead to altered gene transcription. A hydrogel responsive to endocrine disrupting chemicals (EDC) can be developed to demonstrate the ability to detect a specific class of toxins. One design utilizes receptor-ligand interactions and involves conjugating the estrogen receptor (ER) and its natural ligand, estradiol, to a hydrogel network. Noncovalent crosslinks can be formed by the interaction of estradiol with the ER, shifting the hydrogel into a contracted state. Above a threshold concentration of a competitive ligand (i.e., any EDC), the noncovalent crosslinks are disassembled, causing the hydrogel to revert to its expanded state.

Another example of microscale detection of a toxin is botulinum toxin (BoNT). Botulinum toxin is one of the most poisonous toxins known, and causes human poisoning at exceedingly low concentrations. The extraordinary potency of botulinum neurotoxin is attributed to its extreme neurospecificity and the catalytic cleavage of neuronal substrates involved in exocytosis at an extremely low toxin concentration. Upon aerosol exposure, intestinal ingestion, or wound infection, the various serotypes of botulinum toxin bind rapidly (within a few hours) to nerve terminals. Thus, a very narrow window of opportunity exists for conventional intervention approaches, such as parenteral administration of antitoxins. Consequently, it would be extremely valuable to have a device that can rapidly detect poisonous levels of botulinum toxin.

BoNT also has emerged as an extremely important pharmaceutical for the treatment of a myriad of neuromuscular disorders, including focal dystonias, spasticity, tremors, migraine and tension headaches, and other maladies. A disadvantage of BoNT therapy is the observation that certain individuals gain immunity to the toxin and become refractory to treatment. Thus, a sensitive method of detecting antibodies in the serum of BoNT-treated individuals could aid the physician in prescribing dosing regimens. Such an assay could also be used to rapidly and sensitively assess the immune status of individuals. A rapid and sensitive assay for botulinum toxin also could be used to detect diffusion of the toxin from the injection site in pharmaceutical applications, thus avoiding undesired secondary tissue effects or systemic poisoning. A rapid and accurate assay for BoNT, therefore, could be of considerable value in enhancing the medical applications of BoNT.

The most sensitive test currently available for BoNT is the mouse bioassay test (sensitivity of one mouse unit or about 10 pg; femtomolar range). However, the mice assay has many drawbacks, such as practicality of maintaining mouse colonies, the long time for detection (up to two days), and the need for immunologic confirmation. Current in vitro assays, such as ELISA, are relatively insensitive, and under best case conditions detect about 10–100 mouse units (about 100–1000 pg) per ml of solution. Problems also exist in sampling and concentrating the toxins from biological specimens and other sources, such as aerosols, powders, soils, and other matrices.

The microscale devices of the present invention provide a rapid detection of protein toxins by use of a hydrogel having crosslinks that are specific peptide sequences cleaved by BoNT. In addition, a single BoNT molecule can cleave multiple crosslinks because of its catalytic mode of activity. Consequently, such a microscale device can detect a very low level of BoNT. Furthermore, the microscale device can contain a hydrogel that reversibly responds to BoNT, or is in the form of a "bio-fuse," wherein the toxin irreversibly changes the crosslinked hydrogel.

Figures 8A, 8B:
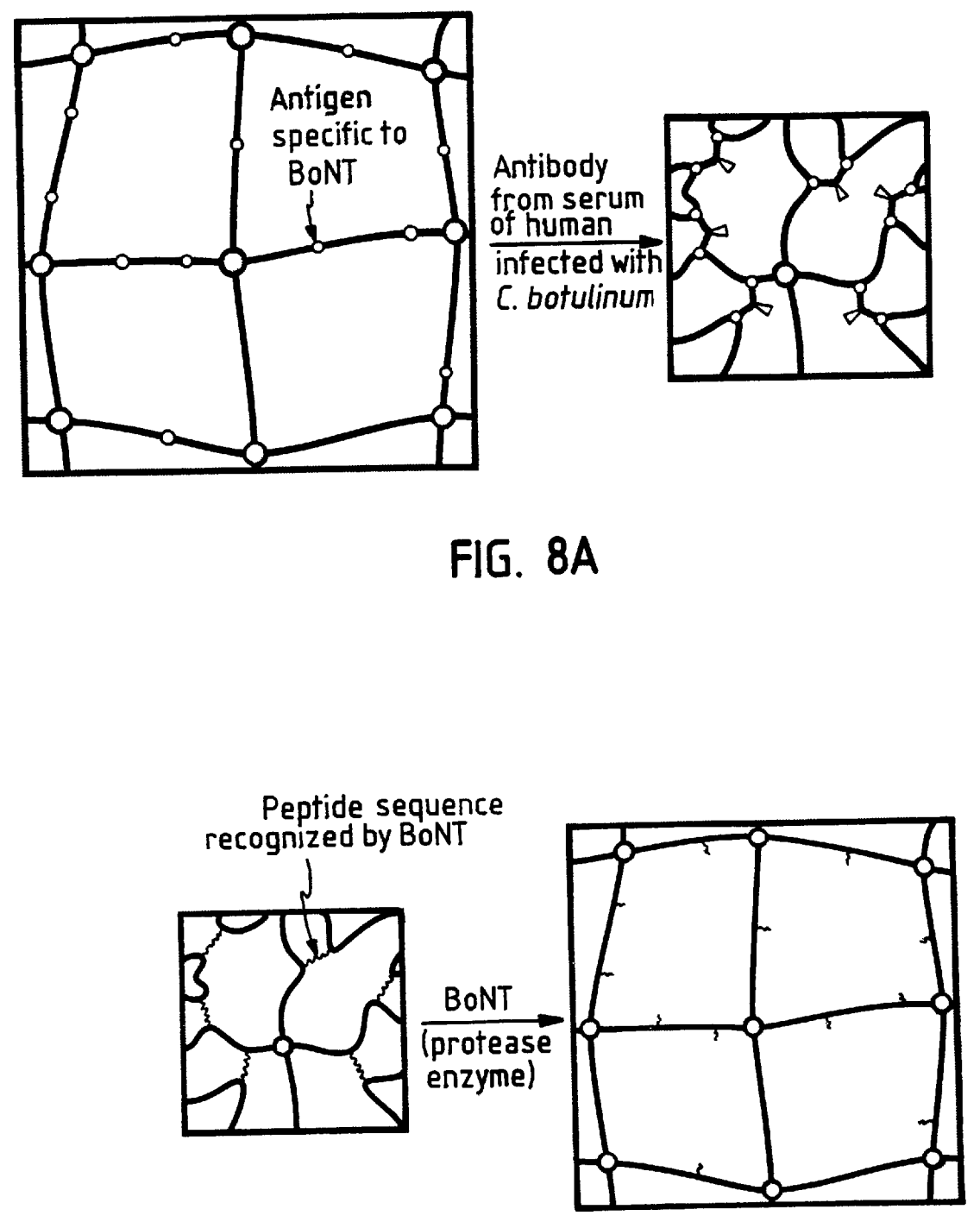

A hydrogel useful in a present microscale device for the detection of BoNT is illustrated in FIG. 8. In particular, FIG. 8a illustrates a hydrogel for detection of host response, thereby providing a method of determining which individuals are infected by the toxin, and to what degree. In particular, FIG. 8a illustrates a hydrogel network conjugated to an antigen that is known to activate a human immune response against BoNT. Antibodies from serum of an individual infected with BoNT further crosslinks, and, therefore, collapses, the hydrogel as illustrated in FIG. 8a. In particular, upon exposure to infected sera, antigen-antibody pairs form noncovalent crosslinks causing the hydrogel to contract. Antigens suitable for conjugation to hydrogel include the c-terminus of the BoNT heavy chain.

FIG. 8b illustrates a hydrogel "bio-fuse" in which the crosslinks are a specific peptide sequence recognized and cleaved by BoNT. Cleavage of the crosslinks results in expansion of the hydrogel which is coupled to a macroscale detection of the volume change.

As illustrated in FIG. 8, the degree of crosslinking changes upon exposure to the stimulus. The degree of swelling of a polymer network is inversely proportional to the degree of crosslinking, especially in a region of low crosslink density. By attaching responsive segments to the polymer network that form or break crosslinks upon exposure to the stimulus, the hydrogel can undergo dramatic changes in volume, provided the initial crosslink density is sufficiently low, i.e., has a crosslink density of less than 15, preferably less than 10, and most preferably less than 7. The crosslink density, however, is sufficient to prevent solubilization of the polymer comprising the hydrogel. This allows a microscale event to create a macroscale detection of an antigen.

Accordingly, microscale devices responsive to different chemical and biological stimuli can be prepared. The microscale devices can detect, for example, environmental toxins specific to endocrine disrupting chemicals; a host-defense response specific to BoNT; and bacterial protein toxins. Examples of toxins other than BoNT that can be detected include, but are not limited to, anthrax and Ebola. Hydrogels conjugated with biomolecules specific to a particular chemical or biological agent can be prepared utilizing a judicious device of hydrogel and biomolecule. Such a choice can be readily determined by persons skilled in the art.

In another embodiment, a hydrogel can be derivatized or modified to provide a biological response microscale component. For example, a hydrogel can be coated with a lipid or fatty acid to provide a pH-sensitive hydrogel matrix surface modified with a lipid bilayer that contains channel proteins or receptors to form a "gel cell." Because the lipid coating is impermeable to ions, a pH different from the pH of the surrounding medium can be maintained within the hydrogel interior, allowing the hydrogel to remain contracted while surrounded in a pH environment that normally causes volume expansion. Upon exposure of the surface to a specific stimulus, the lipid bilayer is disrupted, causing the hydrogel to swell, and thereby signal the presence of the stimulus.

To illustrate a gel cell, a pH-sensitive hydrogel having terminal hydroxy groups and containing a pH indicator (e.g., phenolphthalein) is prepared in a microchannel using the above-described technique. The hydrogel has a diameter of 400 $\mu$m. The hydrogel then is immersed in benzene and modified by covalently bonding fatty acids to the surface of the hydrogel via the hydrogel hydroxy groups. The modified hydrogel then is exposed to an alkaline solution (which normally causes the hydrogel to swell) and the hydrogel diameter is measured at timed increments to test the efficiency of the fatty acid layer as a barrier. Hydrogels modified with a fatty acid coating remain stable for several days without an observable change in color or volume. In contrast, unmodified hydrogels that contain the pH indicator are fully expanded in the alkaline solution within 40 minutes together with a color range from clear to pink. When exposed to an alkaline buffer solution (pH 12), a fatty acid modified hydrogel showed no volume or color change until the fatty acid layer was physically disrupted by piercing the gel with a micropipette tip, which caused the gel to rapidly swell and change color. The modified hydrogels, therefore, are capable of swelling and changing color after the fatty acid layer is disrupted, and can be used to detect a microscale event.

The photopolymerization of a polymerizable mixture in the fabrication of microelectronic devices was further demonstrated, with high resolution, by flowing a polymerizable mixture into prefabricated microchannels. In a typical procedure, a glass channel, about 500 to about 2000 μm wide and about 50 to about 180 μm deep, was filled with a polymerizable mixture containing acrylic acid and 2-hydroxyethyl methacrylate (HEMA) (in a 1:4 mol ratio), ethylene glycol dimethacrylate (EGDMA) (1 wt %), and a light-sensitive initiator (3 wt %). The polymerizable mixture was allowed to reach a quiescent state, and then exposed to ultraviolet light through a photomask placed on top of the channels. When the polymerization was completed, the channel was flushed with deionized water to remove the unreacted polymerizable mixture. Polymerization time varied depending on light intensity and initiator, but is as fast as 20 seconds using a photoinitiator and an unfiltered light source from a standard fluorescence microscope. The resulting polymer gel can be used as a pH sensor/actuator.

The pattern of the photomask provided a polymer gel having the shape of the pattern, with good resolution and high fidelity. A polymer gel with features as small as 25 μm have been fabricated, and gel size is limited only by mask resolution. The fabrication of multiple microscale components can be achieved either sequentially or simultaneously with multiple microscale components defined on a single mask. Components made of different polymers can be made sequentially.

With further reference to the Figures, various embodiments disclosed above are illustrated.

Figure 9:
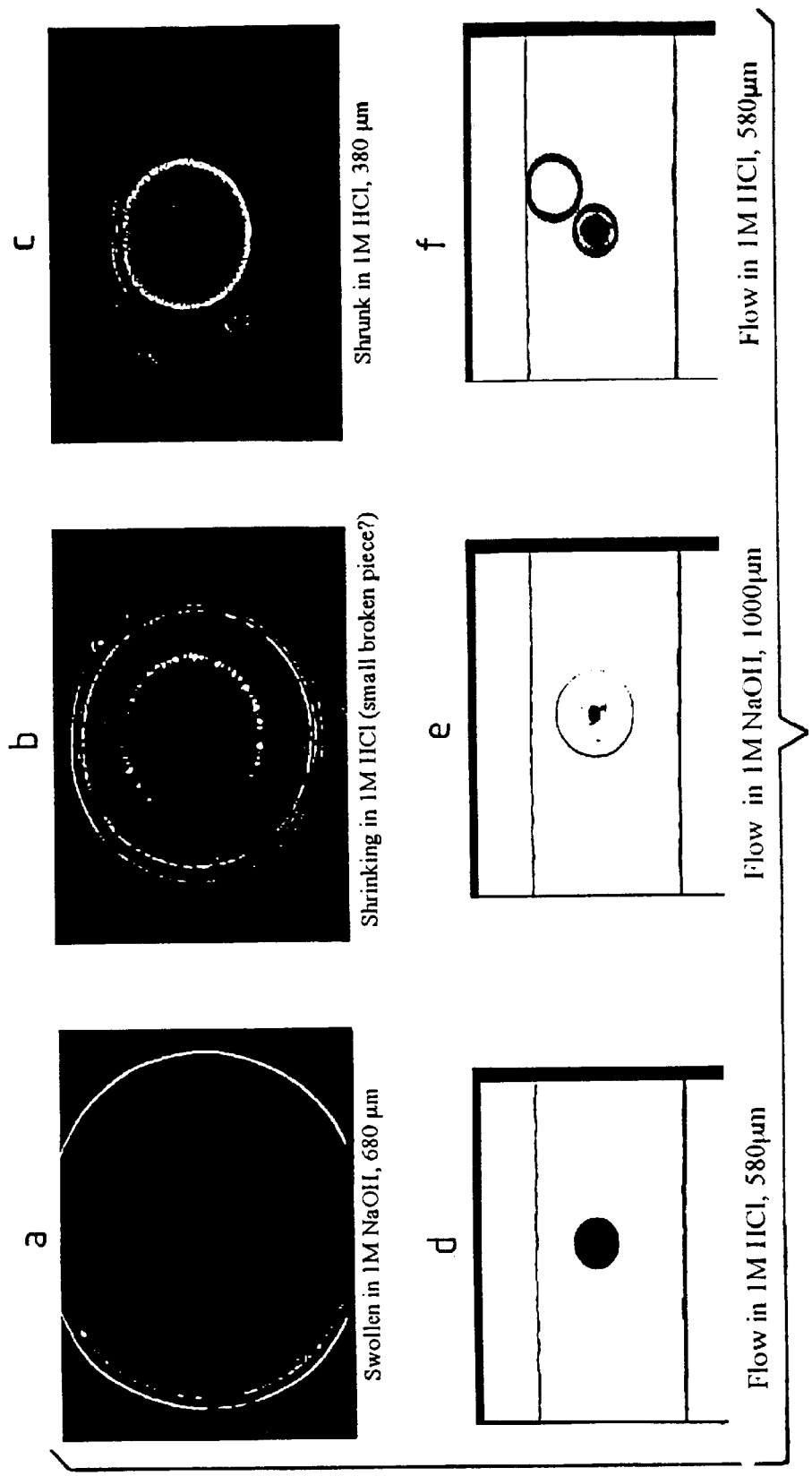
FIG. 9 illustrates volume changes of a microscale hydrogel component in response to pH changes.

FIG. 9 illustrates the response of a pH-sensitive sensitive polymer gel positioned in a microscale channel. The polymer gel was polymerized in the channel to provide a spatially defined structure that varies in size from 380 μm in 1 M hydrochloric acid to 680 μm in 1 M sodium hydroxide (FIG. 9a–c). FIG. 9 also illustrates that the pH-sensitive polymer gel reversibly and reproducibly changes in size as fluid flow in the channel varies from acid to base, then back to acid (FIG. 9d–f).

Polymer gels of the appropriate composition and geometry, therefore, reversibly expand and contract, but are otherwise stable in the microfluidic stream. For example, polymer gels comprising poly(HEMA) can undergo many cycles of volume transition without fatigue. Preferably, the lateral dimension of the gel is equal to or larger than the height to reduce folding or buckling of the polymer gel due to volume changes. Such dimensions also help anchor the gel, and prevent the gel from migrating downstream during fluid flow. Some gel sizes and shapes, especially gels having a large aspect ratio, tend to fatigue from repeated volume transitions due to the development of high internal stress concentrations. The time response of the volume change roughly follows the square of the dimension. A response of less than 10 seconds was observed for a polymer gel 100 μm in diameter in a 50 μm deep channel.

Figure 10:
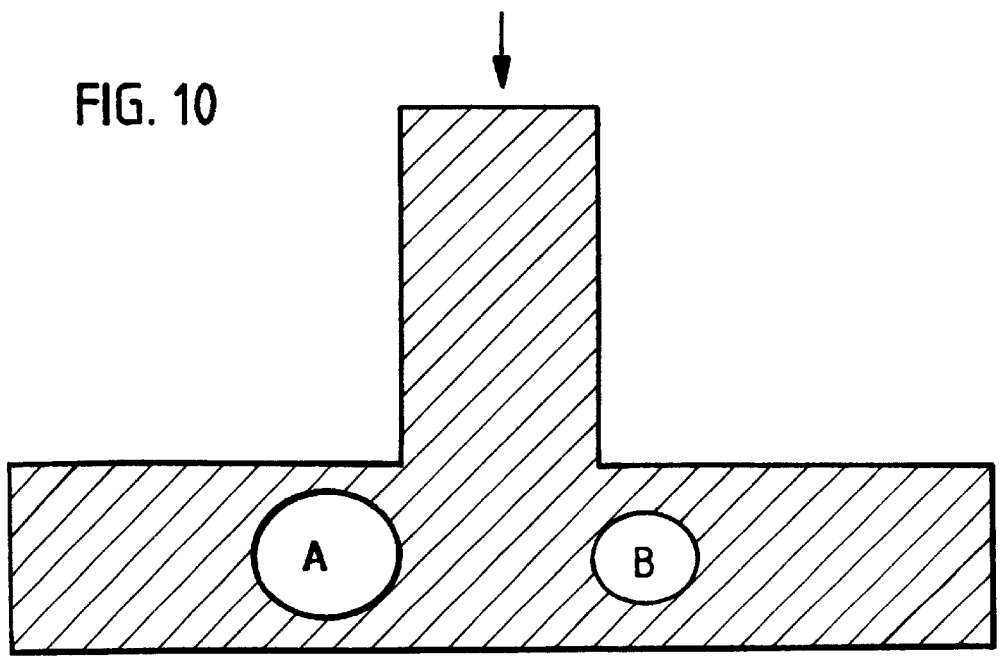
FIG. 10 illustrates a flow router prepared by the method of the present invention.

FIG. 10 illustrates a microscale flow routing device containing two different polymer gels. The function of the flow routing device, for example, is to control flow of a fluid flowing in the direction of the arrow. The two polymer gels positioned in the microchannel respond differently to the presence of an acid and base, for example. In particular, gel A swells in the presence of a base, and contracts in the presence of an acid. Gel B, in contrast, contracts in the presence of a base and swells in the presence of an acid. Accordingly, an acidic fluid flowing in the direction of the arrow is routed to the left. An alkaline fluid flowing in the direction of the arrow is routed to the right. The pH responsive microscale device illustrated in FIG. 10, therefore, performs the sensor and actuation functions normally performed by discrete device components (e.g., valve, sensors, and electronics) in a traditional system.

The two different polymer gels of FIG. 10 are sequentially positioned in the channel. First, a polymerizable mixture A is introduced in the channel, then photopolymerized at location A while masking the remainder of the channel. Residual, unreacted polymerizable mixture A is flushed from the channel. A polymerizable mixture B then is introduced into the channel, followed by polymerizing mixture B by masking the channel except for location B and photopolymerizing at location B. Unreacted, residual polymerizable mixture B from the channel then is flushed to provide the flow routing device illustrated in FIG. 10.

In general, flow in a channel can be regulated by a volume change of the polymer gels. Flow regulation was demonstrated by measuring the pressure drop at constant flow rate over a channel containing polymer gels. In this test, 1×9 array of oval components, each 300×700 μm. were polymerized along the length of 1000 μm wide glass channel. Pressure drop measurements were taken at a constant flow rate of 0.15 ml/min, while the polymer gels were allowed to contract and expand by changing the pH. At a pH of 1.8, the gels were in a contracted state and produced a pressure drop of 0.09 psi. After raising the pH to 12.9, the gels were fully expanded to cause the pressure drop to increase almost eight-fold. The present invention, therefore, provides a simple-to-fabricate microscale device that functions as a pH-sensitive throttle valve for microfluidics.

Figure 11:
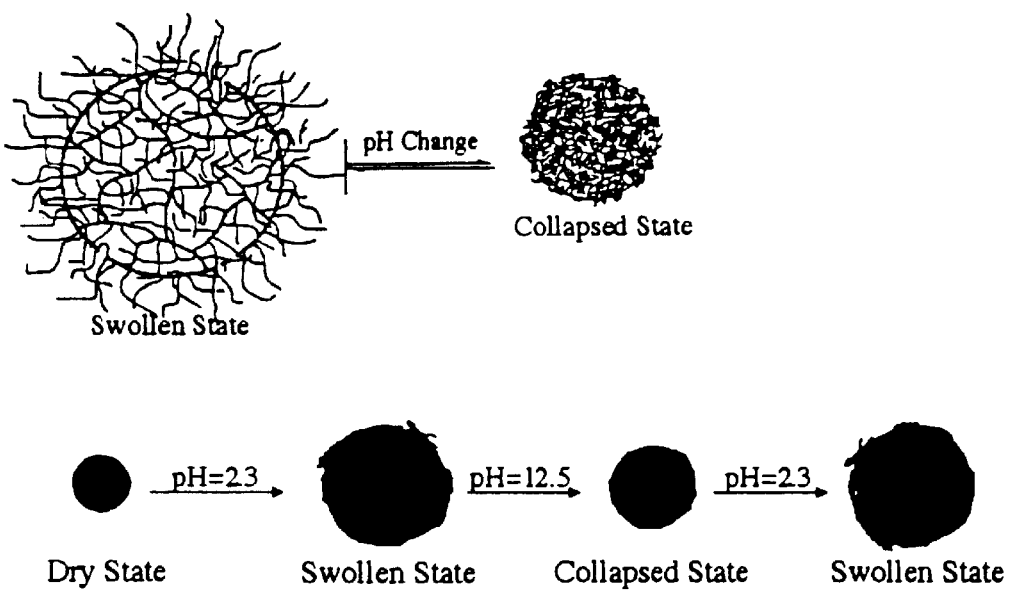
FIG. 11 illustrates pH-sensitive beads of the present invention, and the reproducible response of the beads to a pH change.

FIG. 11 further illustrates a pH-sensitive polymer gel manufactured in a microscale channel. The pH-sensitive polymer gel comprises a polystyrene core having a pH-responsive hydrogel on the core surface. FIG. 11 also illustrates the reproducible response of the pH sensor to changes in pH.

The following reaction schemes illustrate various specific polymerizable mixtures used in the microfabrication method of the present invention. The reaction schemes illustrate that the pH-sensitive polymer gels prepared at a predetermined location in a microscale channel can be water based or organic based. The reaction schemes also illustrate a rigid, highly crosslinked polymer that can be used structurally as opposed to functionally, e.g., to manufacture walls of the microscale channels.

a) Water-based pH-sensitive polymers

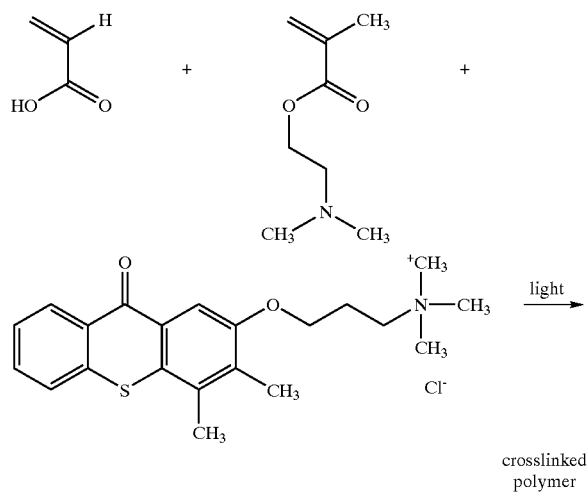

crosslinked polymer b) Organic-based pH-sensitive polymer

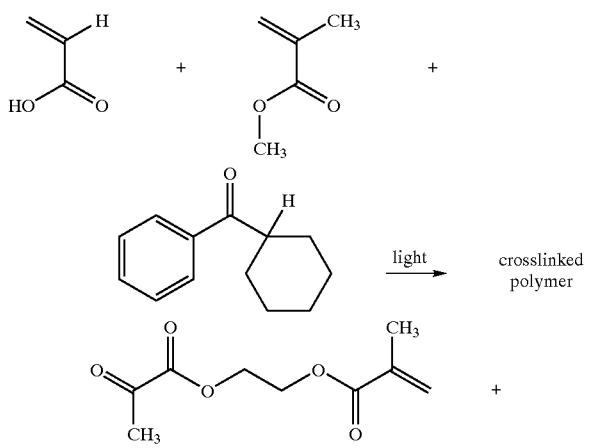

c) Rigid, impermeable, highly crosslinked networks

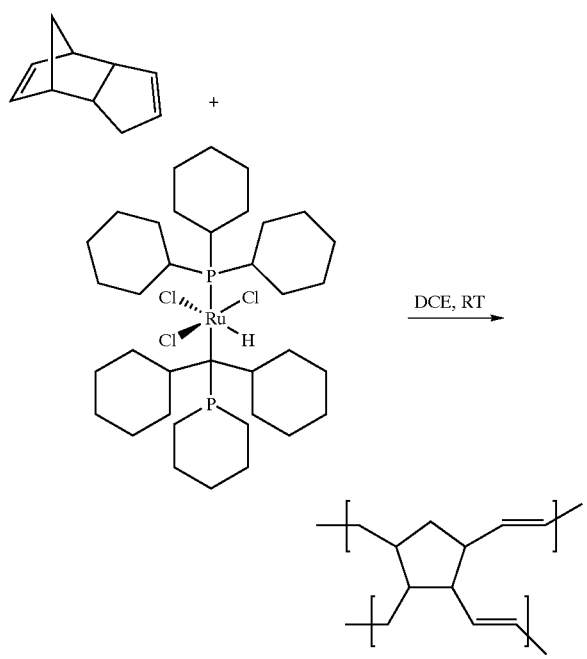

Figure 12:
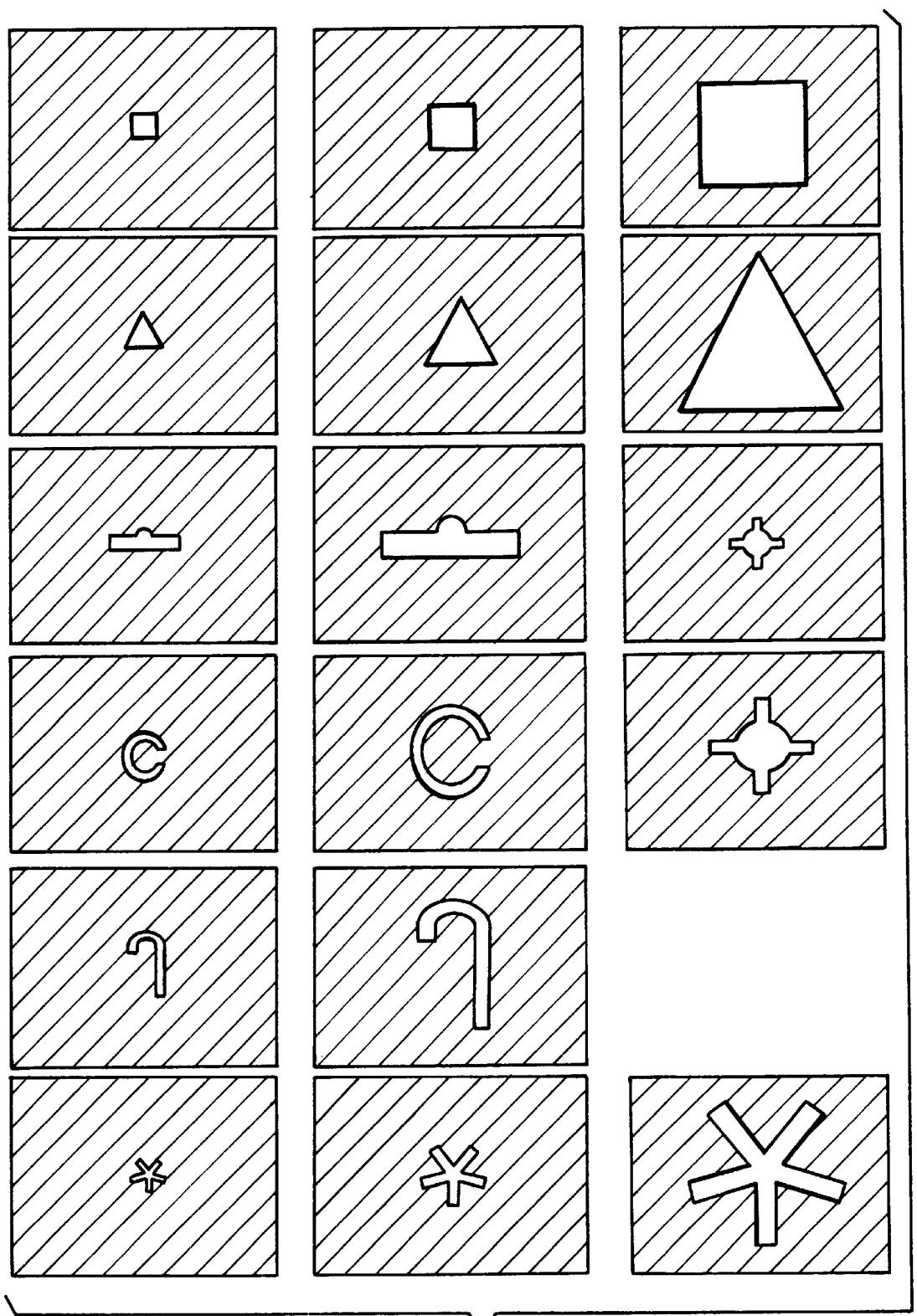
FIGS. 12 and 13 show different complex geometries of microscale components.
Figure 13:
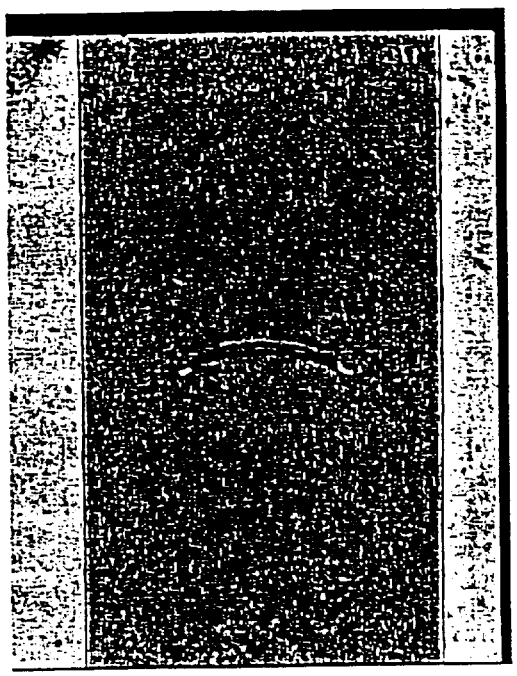
Figure 13:
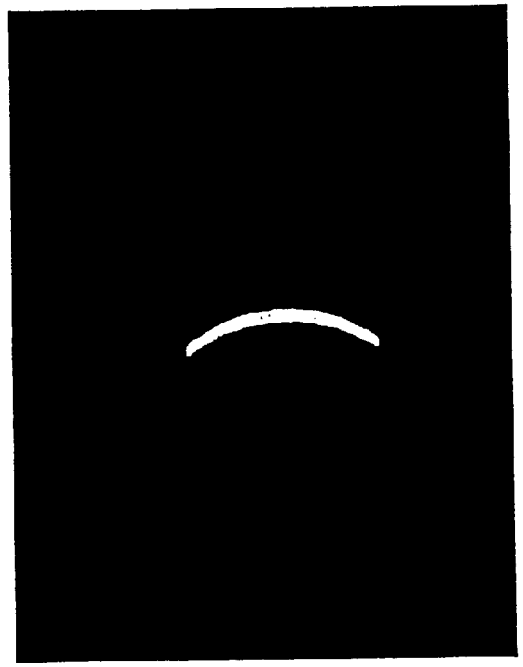

FIG. 12 illustrates that various differently shaped polymer gels can be synthesized within the microscale channel. A polymer corresponding to each shape has been prepared by using the appropriately shaped mask. This is further illustrated in FIG. 13, which illustrates a curved mask and the curved polymer gel resulting from the mask. FIG. 13 further illustrates that the polymer gel prepared in the channel has a geometry that is dimensionally sharp and is essentially identical to the shape of the mask.

The photoinitiated polymerization, therefore, is essentially limited to the location of the channel that is exposed to the incident radiation. It was observed that the polymerization reaction does not extend radially under the mask to any substantial degree. It is theorized, but not relied upon herein, that polymerization is limited to exposed locations in the channel because the exotherm in such a microscale reaction is sufficiently low such that heat initiated polymerization does not occur radially under the mask.

Figure 14:
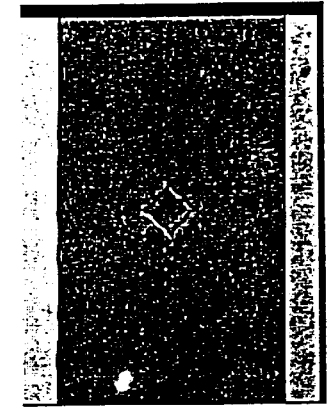
FIGS. 14 and 15 show different shapes of polymer hydrogels prepared within a microscale channel.
Figure 14:
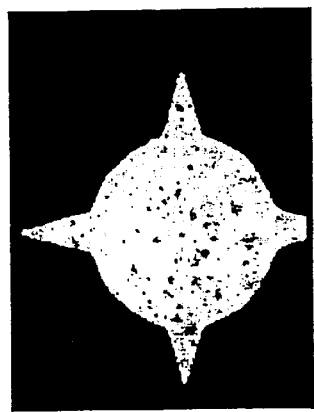
Figure 14:
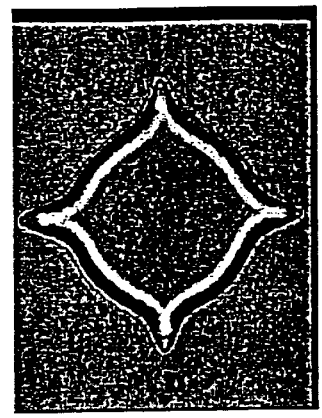
Figure 14:
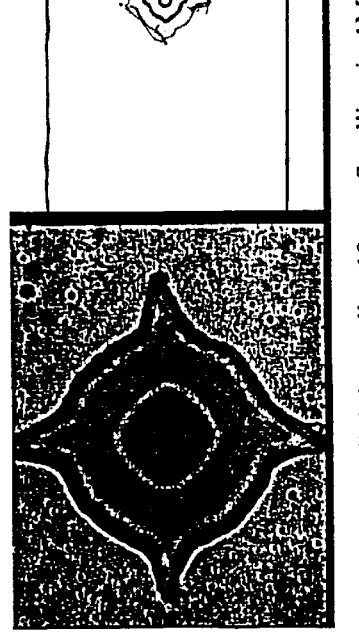
Figure 14:
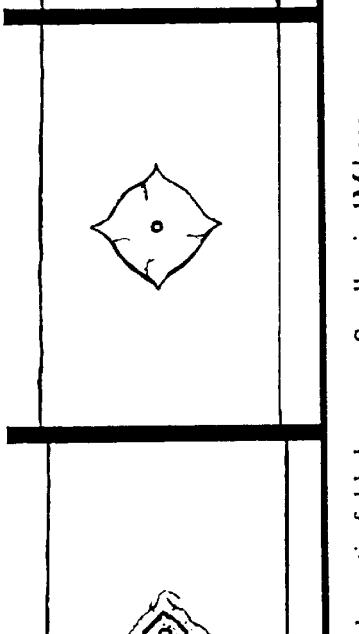
Figure 14:
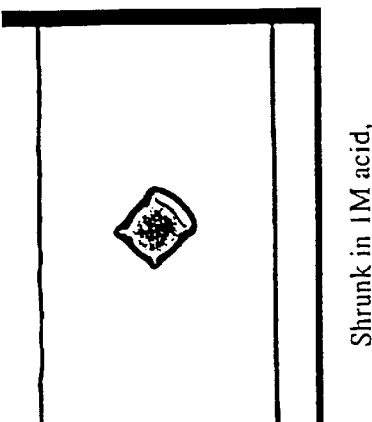
Figure 15:
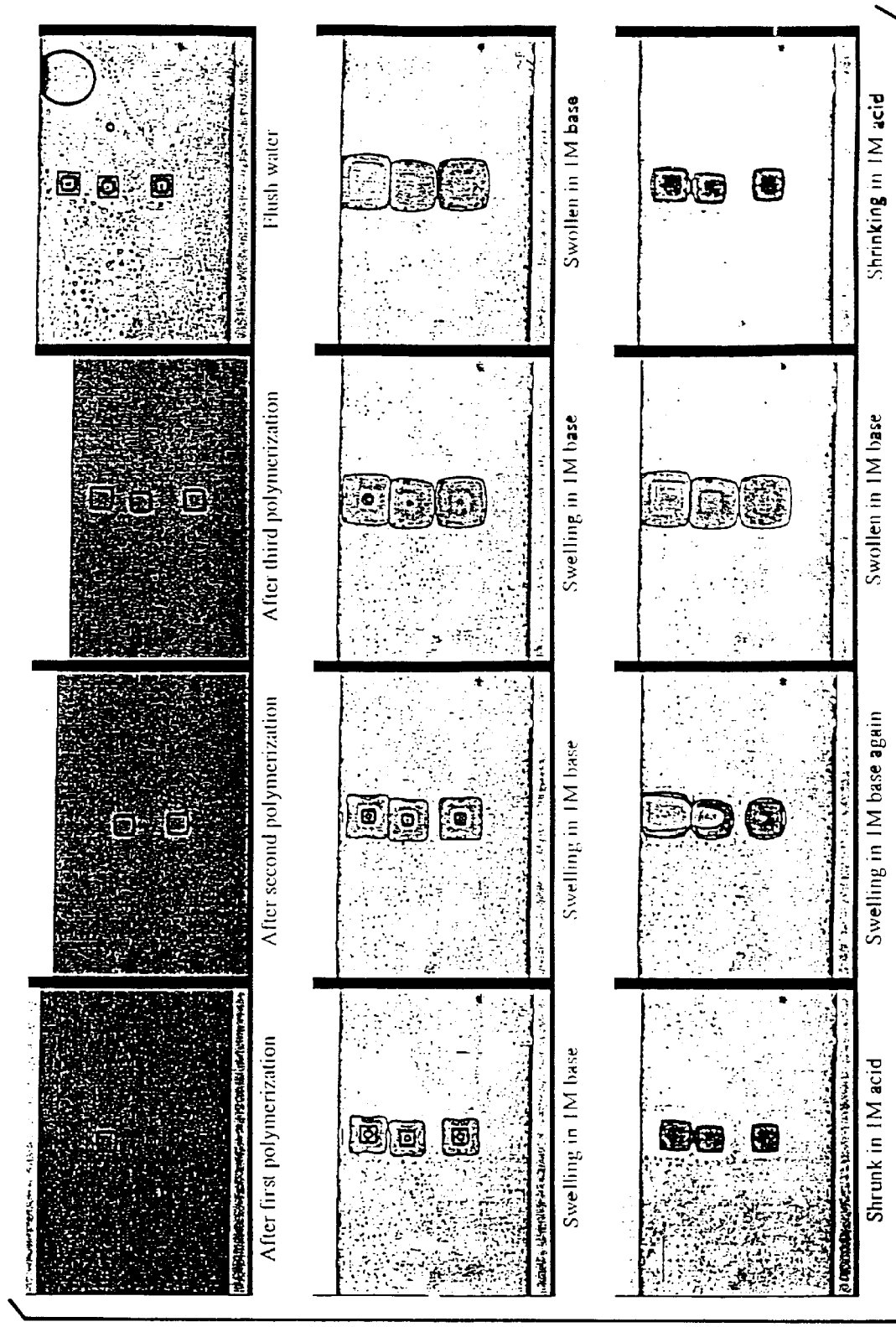

FIGS. 14–15 illustrate various shapes of polymer gels prepared within a microscale channel by photoinitiated polymerization. FIG. 14 illustrates that a relatively complex geometry can be prepared and can reproducibly respond to stimuli, e.g., pH, and thereby act as a sensor. FIG. 15 illustrates that more than one polymer gel can be positioned at a preselected location within a microscale channel. FIG. 15 further illustrates that the individual polymer gels can be manufactured in sequence by adjusting the position of the mask. If the three polymer gels in FIG. 15 are identical, microfabrication of the polymer gel is achieved by introducing a single polymerizable mixture into the channel and performing a single or sequential photoinitiated polymerization wherein either a single mask allows all polymer gels to be manufactured simultaneously, or a mask is adjusted to allow a different location of the channel (and the polymerizable mixture) to be exposed to incident radiation.

In embodiments where it is desirable to have different polymer gels fabricated in a channel to take advantage of different types of responses, or different response times or volumes, for example, different polymerizable mixtures are introduced into the chamber sequentially after each photoinitiated polymerization and rinsing of the chamber, followed by a proper adjustment of the mask. Alternatively, three separate polymerizable mixtures can be introduced into a microscale channel by utilizing laminar flow. The three polymer gels then can be prepared simultaneously by utilizing a suitably configured mask and exposing the channel to suitable incident radiation. The proper or ideal wavelength to effect polymerization of each polymerizable mixture can be achieved by using filters, for example. FIG. 15 further illustrates that an array of polymer gels in a channel can be used to regulate flow in response to a pH change.

FIG. 16 illustrates macroscale detection methods for a microscale event. FIG. 16a contains a top and side view of a sensor for more than one chemical or biological agent. In the absence of a stimulus, the hydrogel is in a contracted state and the device appears colored from the top view. The hydrogel sensor expands (right bottom) in response to a stimulus and it presses against the top internal surface of the device to change the optical properties by excluding dye from that region. Each hydrogel component responds to a different stimuli giving rise to unique patterns for different chemical and biological agents.

In FIG. 16b an elastic membrane and sensor/actuator are both made by the present method. The elastic membrane is formed first, then hydrogel sensor/actuator is fabricated. Hydrophobic vents are used to flush and fill the chambers and a hydrophobic valve is used to keep the two solutions separated. When a sample is introduced and detection occurs, the hydrogel expands pushing a first solution into second solution to produce a colored product.

FIG. 17 illustrates a biomimetric valve prepared by the present method. In a typical procedure, two pH-sensitive strips are prepared simultaneously (FIG. 17a). Then, non-pH-sensitive strips prepared from HEMA, EGDMA (1.0 wt %) and IRGACURE® 651 (3.0 wt %) (FIG. 17b) formed the bi-strip hydrogel valve with anchor. When exposed to a basic solution, the bi-strip hydrogel expands and curves to form a normally closed valve (FIG. 17c). The bi-strip valve can be pushed open (FIG. 17d) to allow flow in one direction (from left to right) while restricting flow in the opposite direction (FIG. 17e). When exposed to acidic solutions (FIG. 17f), the valve is deactivated, returning to the permanently open state. Scale bars in FIG. 17 are 500 µm. The non-pH-sensitive hydrogel strip also has an anchor that fixes one end of the bi-strip hydrogel to the channel top and bottom at the desired location. The non-pH-sensitive strip remains the same volume, causing the bi-strip gel to curve towards the non-pH-sensitive strip. The microscale valve operates like the passive valves found in veins, allowing the fluid flow in only one direction. The pH-sensitive strip serves as a spring to provide a restoring force for the valve. When contacted in acidic solution, the valve becomes deactivated and remains permanently open (FIG. 17d). In this example, the valve responds to the local chemical environment in addition to the local fluid flow characteristics.

The previous discussion illustrates positioning and anchoring of a polymeric gel within a microscale channel by the use of a polymerizable mixture, laminar flow, and optical masks. However, a polymerizable mixture also can be properly positioned in a microscale channel utilizing choatic flow. In choatic flow, two liquids appear to be in a mixed state, but the mixed state is constant. For example, a theoretical video of choatic flow shows no change and the video is essentially a still photograph. In contrast, a theoretical video of turbulent flow shows constant change, i.e., is not a still photograph, but is a motion picture.

Figure 18:
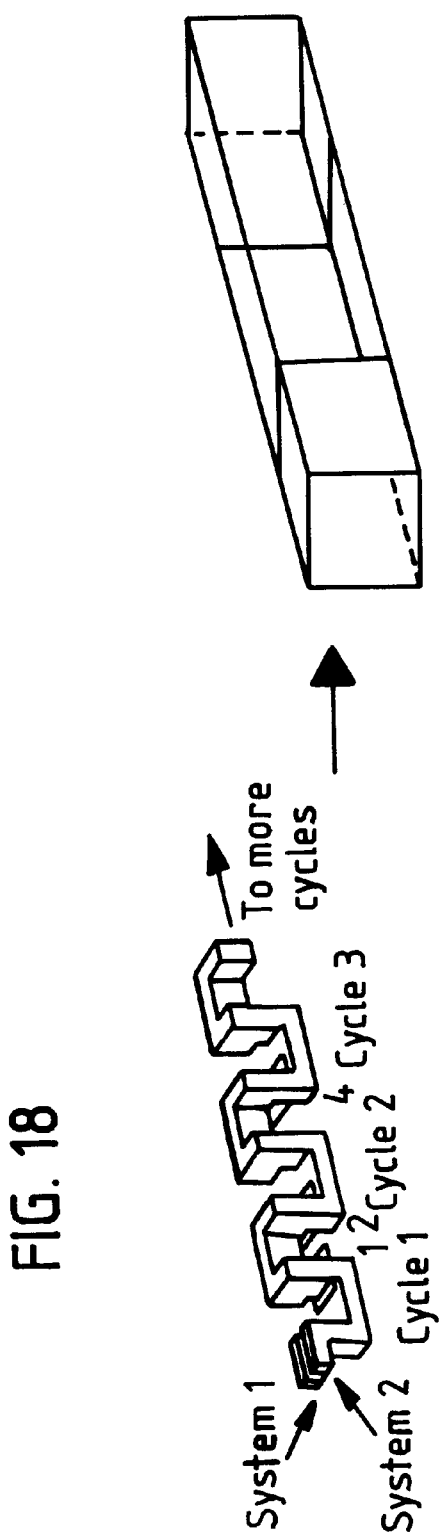
FIG. 18 is a schematic showing the use of choatic fluid flow in the method of the present invention.

FIG. 18 illustrates a blend of a polymerizable mixture and an inert liquid in chaotic flow. The choatic flow positions the polymerizable mixture at preselected positions continuously across the length of the channel. Subsequent photo-induced polymerization provides a continuous polymer gel having a preselected pattern along the length of the channel, as shown in FIG. 18. Such patterning greatly expands design capabilities of a microscale device, and expands the scope of useful applications for such microscale devices.

In accordance with an important feature of the present invention, a polymer gel can be fabricated within a microchannel, wherein the polymer gel has a functionality that can respond to a thermal, physical, chemical, or biological stimulus. This functionality can be achieved by a proper selection of the monomers comprising the polymer gel, or by appropriately derivitizing the polymer gel after microfabrication in the channel, for example, by incorporating a cell or a biological molecule into the polymer gel. The present method provides a fast method of preparing such polymeric functional components for a microscale device. The polymerization times are short, e.g., about 20 seconds, and the polymer gel reproducibly responds to an external stimuli regardless of shape or geometry. The gels respond quickly and accurately to the external stimuli, in part because of the small size of the polymer gel.

The present disclosure therefore is directed to a new method of fabricating microscale devices having functional polymer gels synthesized within microscale fluid channels. The simple and fast microscale fabrication of functional structures having a variety of geometries and sizes within microscale fluid channels has been demonstrated. In one embodiment, the functional structure, i.e., a polymer gel, is a pH-sensitive polymer that expands and contracts in response to changes in pH. In accordance with the present method, polymerizations are used to define polymer gel geometries via masking, and the resulting polymer gel structures are sharply defined and can be used as functional components within microfluidic devices. A pH-responsive throttle valve has been specifically demonstrated. Microscale components containing polymer gels responsive to temperature, electric fields, ionic strength, light, pressure, carbohydrates, and proteins also have been demonstrated.

The present method permits the fabrication of complex microsize fluid flow devices having a plurality of functional components, including sensors, valves, pumps, and optoelectronic components, without traditional assembly processes, because the microscale components are formed in situ within the channels. The present method also can be used to fabricate the microscale channels on a substrate.

In addition, because the resulting polymer gel components are functional (e.g., pH sensitive), the need for power sources, electronics, and sensors for actuation, control, and feedback is eliminated, thereby greatly simplifying the design and manufacture of the device. The present method also utilizes the feature of laminar flow to allow manufacture of polymer gels of preselected chemical identity and dimensions, thereby increasing the functional flexibility of the devices and providing devices having a fast response time.

Obviously, many modifications and variations of the invention as hereinbefore set forth can be made without departing from the spirit and scope thereof.

What is claimed is:

1. A method of manufacturing a microscale component of a microscale device comprising:
    (a) providing a substrate;
    (b) forming one or more microscale channels in the substrate;
    (c) introducing a liquid polymerizable mixture into the channel;
    (d) optically masking the channel to permit exposure of the polymerizable mixture to a polymerization-initiating energy source at a preselected location along the channel;
    (e) exposing the channel to the energy source for a sufficient time to polymerize the polymerizable mixture at the preselected location of the channel to form a polymer gel; and
    (f) removing residual unreacted polymerizable mixture from the channel to provide the microscale component in the channel as a polymer gel.

2. The method of claim 1 wherein the substrate is transparent.

3. The method of claim 1 wherein the substrate comprises glass, a plastic, silicon, or a transparent mineral.

4. The method of claim 1 wherein the channel is formed by a lithographic process.

5. The method of claim 1 wherein the substrate has a cross-section diameter of about 1 micron to about 1 millimeter.

6. The method of claim 1 wherein polymerizable mixture has a Reynold's number of about 1 to about 2000.

7. The method of claim 1 wherein a plurality of liquid polymerizable mixtures are simultaneously or sequentially introduced into the channel in a laminar array.

8. The method of claim 1 wherein one or more liquid polymerizable mixtures and one or more inert liquids are simultaneously or sequentially introduced into the channel in a laminar array.

9. The method of claim 1 wherein one or more liquid polymerizable mixtures and one or more inert liquids are simultaneously or sequentially introduced into the channel in a choatic flow stream.

10. The method of claim 9 wherein the inert liquid has a Reynold's number of about 1 to about 2000.

11. The method of claim 1 wherein the polymerizable mixture comprises a monofunctional monomer, a polyfunctional crosslinking monomer, or a mixture thereof.

12. The method of claim 11 wherein the polymerizable mixture further comprises a photoinitiator, an optional surfactant, or a mixture thereof.

13. The method of claim 1 wherein the microscale component has a diameter-to-height ratio of about 10 to 1 to about 0.5 to 1.

14. The method of claim 1 wherein the polymerization-initiating energy source comprises light, heat, vibration, an electrical field, or a magnetic field.

15. The method of claim 14 wherein the energy source comprises ultraviolet light.

16. The method of claim 1 wherein an anchoring material is positioned at the preselected location of the channel.

17. The method of claim 16 wherein the anchoring material comprises a chemical anchor.

18. The method of claim 17 wherein the anchoring material comprises a metal film, a photoinitiator, a monomer, or a mixture thereof.

19. The method of claim 17 wherein the anchoring material comprises a mechanical or physical anchor.

20. The method of claim 1 further comprising a step of derivatizing the polymer gel.

21. The method of claim 20 wherein the polymer gel is derivatized by attaching a biomolecule to the polymer gel.

22. The method of claim 20 wherein the polymer gel is derivatized by coating the polymer gel with a fatty acid or a lipid.

23. The method of claim 1 wherein the polymer gel is capable of undergoing a volume change in response to a predetermined stimulus.

24. The method of claim 23 wherein the stimulus is a physical change in a medium contacting the gel.

25. The method of claim 24 wherein the physical change is a temperature change, an electric field change, a change in light, or a pressure change.

26. The method of claim 23 wherein the stimulus is a chemical change in a medium contacting the gel.

27. The method of claim 26 wherein the chemical change is a pH change or an ionic strength change.

28. The method of claim 23 wherein the stimulus is a chemical compound in a medium contacting the gel.

29. The method of claim 23 wherein the stimulus is a biological agent in a medium contacting the gel.

30. The method of claim 29 wherein the biological agent is a toxin, a pathogen, or an antigen.

31. The method of claim 29 wherein the biological agent is botulinum toxin, anthrax, or Ebola.

32. A method of manufacturing a functional microscale component of a microscale device comprising:

(a) providing a transparent cell having a cavity;

(b) introducing a blend of structural monomers into the cavity;

(c) optically masking the cavity to define one or more channels in the cell and to permit exposure of the unmasked structural monomer blend to a polymerization-initiating energy source;

(d) exposing the cell to the energy source for a sufficient time to polymerize the structural monomer blend at unmasked locations in the cell to form microchannels;

(e) removing residual unreacted monomer blend from the substrate to provide the channels in the cell;

(f) introducing a second liquid polymerizable mixture comprising functional monomers into the channels;

(g) optically masking the channels to permit exposure of the second polymerizable mixture to a polymerization-initiating energy source at a preselected location along the channel;

(h) exposing the channel to the energy source for a sufficient time to polymerize the second polymerizable mixture at the preselected location of the channel to form a polymer gel; and (i) removing residual unreacted second polymerizable mixture from the channel to provide the functional microscale component in the channel as a polymer gel.

33. The method of claim 32 wherein the cavity in the cell is about 50 to about 250 $\mu$m in height and, independently, about 500 to about 25,000 in width and length.

* * * * *

UNITED STATES PATENT AND TRADEMARK OFFICE
CERTIFICATE OF CORRECTION

PATENT NO. : 6,488,872 B1 Page 1 of 1
DATED : December 3, 2002
INVENTOR(S) : David J. Beebe et al.

It is certified that error appears in the above-identified patent and that said Letters Patent is hereby corrected as shown below:

<u>Column 1,</u>
Line 3, insert the following:

-- STATEMENT OF GOVERNMENT INTEREST
This invention was made with government support under Contract Number DAAG55-97-1-0126 awarded by the Office of Naval Research (ONR)/Army Research Office (ARO) (DARPA). The goverment has certain rights in the invention. --

Signed and Sealed this

Twenty-fifth Day of March, 2003

JAMES E. ROGAN
*Director of the United States Patent and Trademark Office*